(12) United States Patent
Lin et al.

(10) Patent No.: US 11,784,061 B2
(45) Date of Patent: Oct. 10, 2023

(54) CHIP PACKAGE STRUCTURE AND METHOD FOR FORMING THE SAME

(71) Applicant: Taiwan Semiconductor Manufacturing Company, Ltd., Hsinchu (TW)

(72) Inventors: Yu-Sheng Lin, Zhubei (TW); Po-Yao Lin, Hsinchu County (TW); Shu-Shen Yeh, Taoyuan (TW); Chin-Hua Wang, New Taipei (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 172 days.

(21) Appl. No.: 17/184,787

(22) Filed: Feb. 25, 2021

(65) Prior Publication Data

US 2022/0270893 A1    Aug. 25, 2022

(51) Int. Cl.
*H01L 21/48* (2006.01)
*H01L 23/00* (2006.01)
*H01L 23/367* (2006.01)

(52) U.S. Cl.
CPC ........ *H01L 21/4882* (2013.01); *H01L 23/367* (2013.01); *H01L 24/32* (2013.01); *H01L 24/83* (2013.01); *H01L 2224/3226* (2013.01); *H01L 2224/838* (2013.01)

(58) Field of Classification Search
None
See application file for complete search history.

(56) References Cited

U.S. PATENT DOCUMENTS

| | | | |
|---|---|---|---|
| 2001/0001989 A1 | 5/2001 | Smith | |
| 2009/0230544 A1 | 9/2009 | Wang et al. | |
| 2020/0135615 A1 | 4/2020 | Fu et al. | |
| 2022/0270893 A1* | 8/2022 | Lin | H01L 21/4882 |
| 2022/0384304 A1* | 12/2022 | Lee | H01L 23/49838 |

OTHER PUBLICATIONS

Chinese language office action dated Jan. 28, 2022, issued in application No. TW 110131056.

* cited by examiner

*Primary Examiner* — Jack S Chen
(74) *Attorney, Agent, or Firm* — McClure, Qualey & Rodack, LLP

(57) ABSTRACT

A method for forming a chip package structure is provided. The method includes disposing a chip package over a wiring substrate. The method includes forming a first heat conductive structure and a second heat conductive structure over the chip package. The first heat conductive structure and the second heat conductive structure are separated by a first gap. The method includes bonding a heat dissipation lid to the chip package through the first heat conductive structure and the second heat conductive structure. The first heat conductive structure and the second heat conductive structure extend toward each other until the first heat conductive structure contacts the second heat conductive structure during bonding the heat dissipation lid to the chip package.

20 Claims, 31 Drawing Sheets

CHIP PACKAGE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements.

Dozens or hundreds of integrated circuits are typically manufactured on a single semiconductor wafer. The individual dies are singulated by sawing the integrated circuits along scribe lines. The individual dies are then packaged separately. The semiconductor industry continues to improve the integration density of various electronic components (e.g., transistors, diodes, resistors, capacitors, etc.) by continual reductions in minimum feature size, which allow more components to be integrated into a given area. However, more components produce more heat. Therefore, how to improve the heat dissipation efficiency of chip package structures becomes a current challenge.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1B-1 is a top view of the structure of FIG. 1B, in accordance with some embodiments.

FIG. 1C-1 is a top view of the structure of FIG. 1C, in accordance with some embodiments.

FIG. 1D-1 is a top view of the structure of FIG. 1D, in accordance with some embodiments.

FIG. 1D-2 is a cross-sectional view illustrating the chip package structure along a sectional line II-IF in FIG. 1D-1, in accordance with some embodiments.

FIG. 1D-3 is a top view of the structure of FIG. 1D, except the heat dissipation lid, in accordance with some embodiments.

FIG. 5A-1 is a top view of the structure of FIG. 5A, in accordance with some embodiments.

FIG. 5B-1 is a top view of the structure of FIG. 5B, in accordance with some embodiments.

FIG. 6A-1 is a top view of the structure of FIG. 6A, in accordance with some embodiments.

FIG. 6B-1 is a top view of the structure of FIG. 6B, in accordance with some embodiments.

FIG. 7A-1 is a top view of the structure of FIG. 7A, in accordance with some embodiments.

FIG. 7B-1 is a top view of the structure of FIG. 7B, in accordance with some embodiments.

DETAILED DESCRIPTION

Figure 1A:
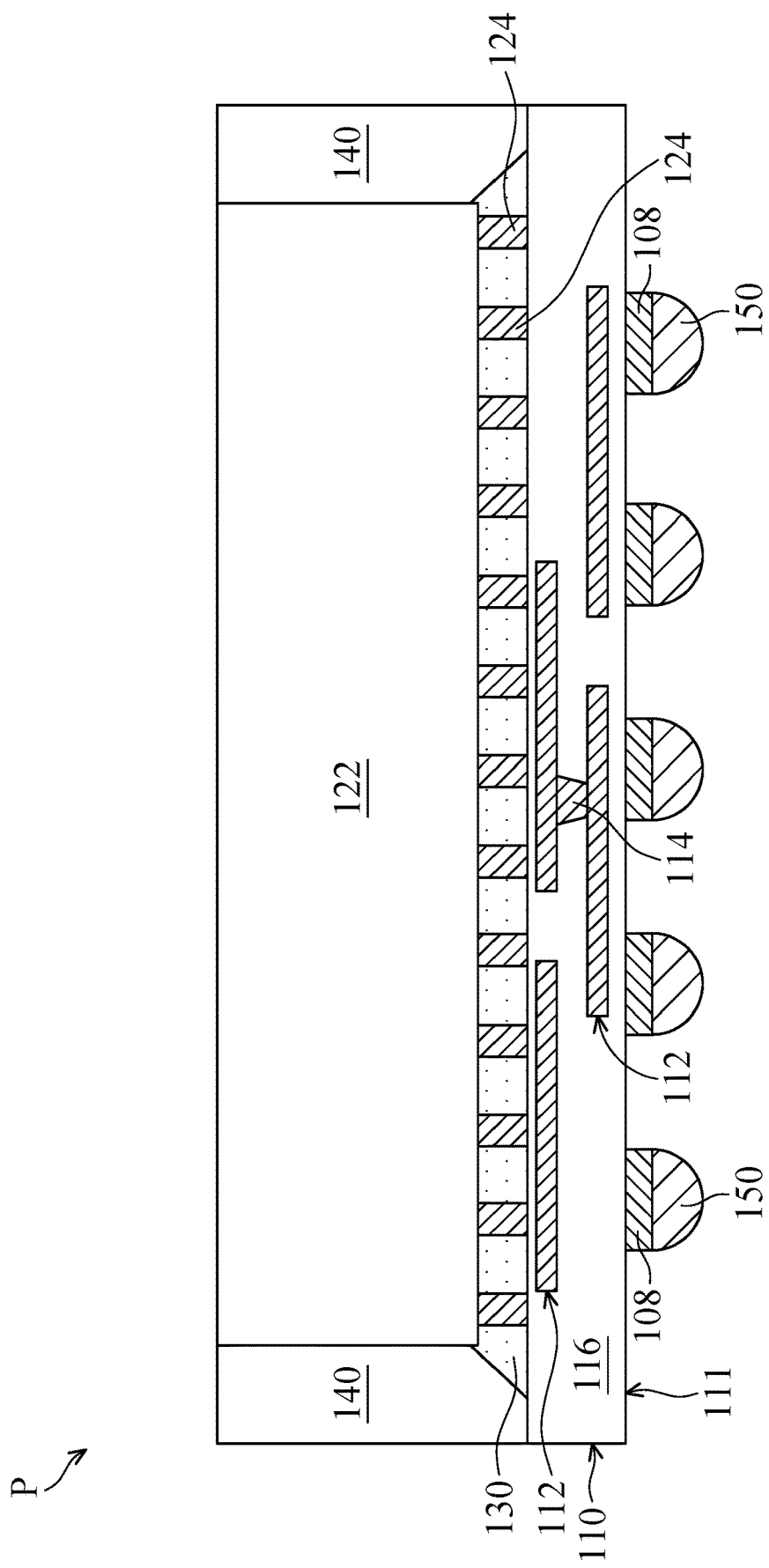
FIGS. 1A-1D are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1D are cross-sectional views of various stages of a process for forming a chip package structure, in accordance with some embodiments. As shown in FIG. 1A, a chip package P is provided, in accordance with some embodiments. The chip package P includes a redistribution substrate 110, a chip structure 122, conductive pillars 124, an underfill layer 130, and a molding layer 140, in accordance with some embodiments.

The redistribution substrate 110 includes wiring layers 112, conductive vias 114, and a dielectric layer 116, in accordance with some embodiments. The wiring layers 112 and the conductive vias 114 are formed in the dielectric layer 116, in accordance with some embodiments. As shown in FIG. 1A, the conductive vias 114 are electrically connected between different wiring layers 112, in accordance with some embodiments. For the sake of simplicity, FIG. 1A only shows two of the wiring layers 112, in accordance with some embodiments.

The dielectric layer 116 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments.

The dielectric layer 116 is formed using deposition processes (e.g. chemical vapor deposition processes or physical vapor deposition processes), photolithography processes, and etching processes, in accordance with some embodiments. The wiring layers 112 and the conductive vias 114 are made of a conductive material, such as metal (e.g. copper, aluminum, or tungsten) or alloys thereof, in accordance with some embodiments.

The chip structure 122 is bonded to the redistribution substrate 110 through the conductive pillars 124, in accordance with some embodiments. The conductive pillars 124 are physically and electrically connected between the chip structure 122 and the redistribution substrate 110, in accordance with some embodiments. The chip structure 122 includes a high-performance-computing (HPC) chip, a system on chip (SoC), a system on integrated circuit (SOIC) device, a CoWoS (chip on wafer on substrate) device or the like, in accordance with some embodiments.

The chip structure 122 includes a substrate, in accordance with some embodiments. In some embodiments, the substrate is made of an elementary semiconductor material including silicon or germanium in a single crystal structure, a polycrystal structure, or an amorphous structure. In some other embodiments, the substrate is made of a compound semiconductor, such as silicon carbide, gallium arsenide, gallium phosphide, indium phosphide, indium arsenide, an alloy semiconductor, such as SiGe or GaAsP, or a combination thereof. The substrate may also include multi-layer semiconductors, semiconductor on insulator (SOI) (such as silicon on insulator or germanium on insulator), or a combination thereof.

In some embodiments, the substrate includes various device elements. In some embodiments, the various device elements are formed in and/or over the substrate. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate. The isolation features are used to surround active regions and electrically isolate various device elements formed in and/or over the substrate in the active regions. In some embodiments, the isolation features include shallow trench isolation (STI) features, local oxidation of silicon (LOCOS) features, other suitable isolation features, or a combination thereof.

In some other embodiments, the chip structure 122 includes a chip package structure. In some embodiments, the chip package structure includes one chip. In some other embodiments, the chip package structure includes multiple chips, which are arranged side by side or stacked with each other (e.g., a 3D packaging or a 3DIC device).

The conductive pillars 124 are made of a conductive material such as copper (Cu), aluminum (Al), tungsten (W), cobalt (Co), nickel (Ni), or tin (Sn), in accordance with some embodiments. The conductive pillars 124 are formed using a plating process such as an electroplating process, in accordance with some embodiments.

As shown in FIG. 1A, the underfill layer 130 is between the chip structure 122 and the redistribution substrate 110, in accordance with some embodiments. The underfill layer 130 surrounds the conductive pillars 124 and the chip structure 122, in accordance with some embodiments. The underfill layer 130 is made of an insulating material, such as a polymer material, in accordance with some embodiments.

As shown in FIG. 1A, the molding layer 140 is formed over the redistribution substrate 110 and the underfill layer 130, in accordance with some embodiments. The molding layer 140 surrounds the chip structure 122, the conductive pillars 124, and the underfill layer 130, in accordance with some embodiments. The molding layer 140 is made of an insulating material, such as a polymer material (e.g., epoxy), in accordance with some embodiments.

As shown in FIG. 1A, the conductive pillars 108 are formed over a bottom surface 111 of the redistribution substrate 110, in accordance with some embodiments. The conductive pillars 108 are made of a conductive material such as copper (Cu), aluminum (Al), tungsten (W), cobalt (Co), nickel (Ni), or tin (Sn), in accordance with some embodiments. The conductive pillars 108 are formed using a plating process such as an electroplating process, in accordance with some embodiments.

As shown in FIG. 1A, solder bumps 150 are formed over the conductive pillars 108, in accordance with some embodiments. The solder bumps 150 are made of tin (Sn) or another suitable conductive material with a melting point lower than that of the conductive pillars 108, in accordance with some embodiments. The solder bumps 150 are formed using a plating process such as an electroplating process, in accordance with some embodiments.

Figure 1B:
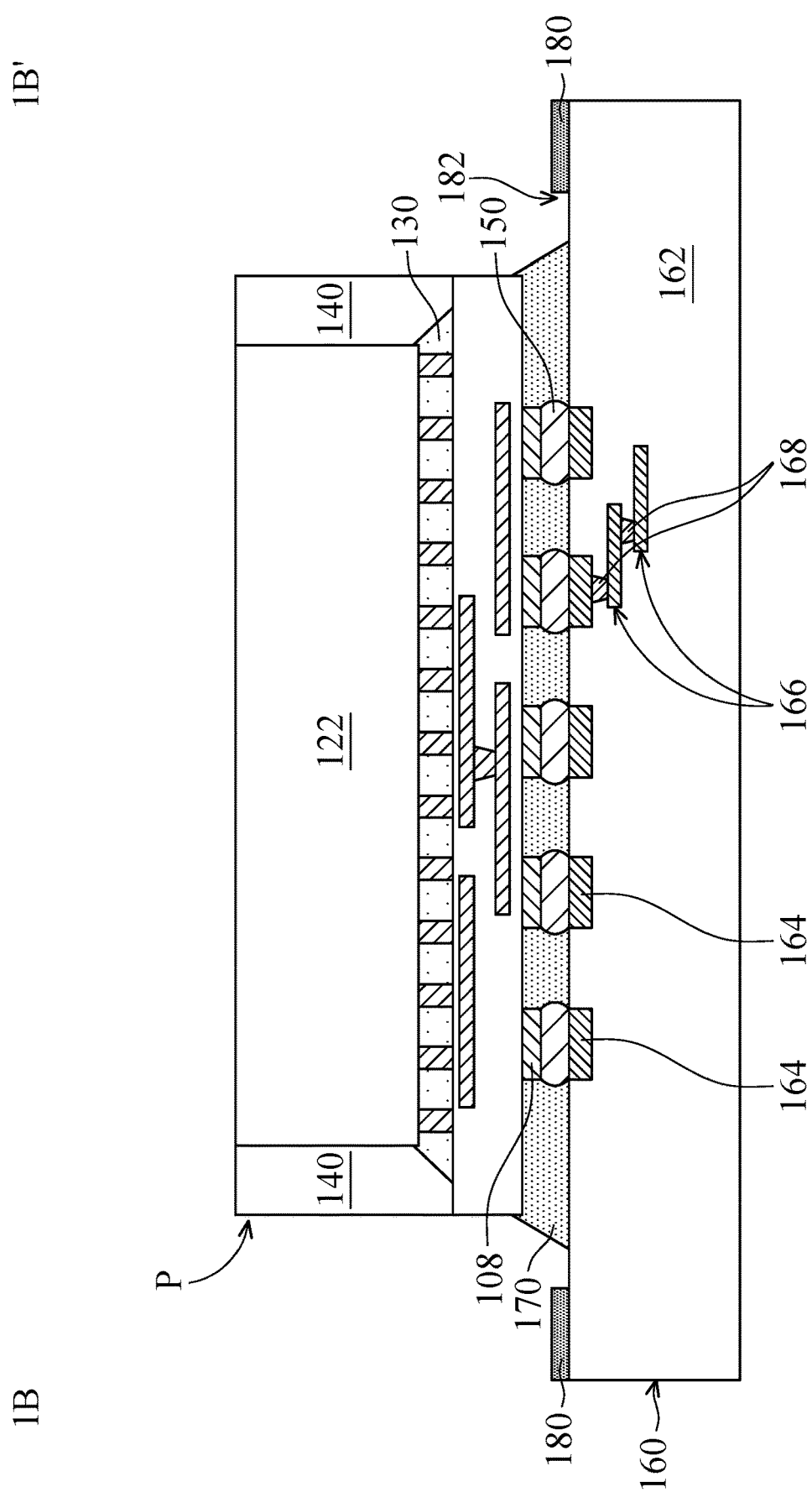
Figures 1, 1B:
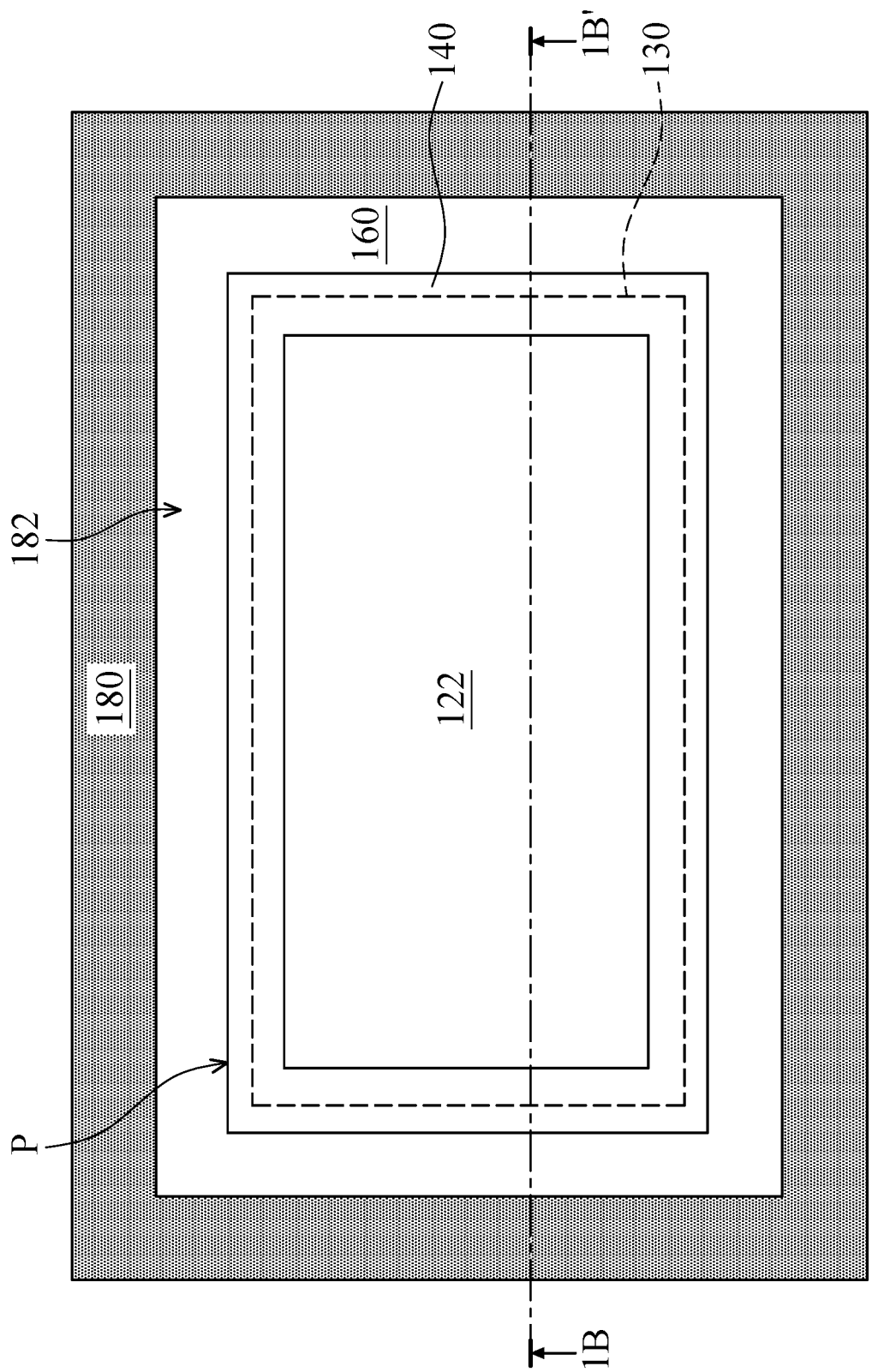

FIG. 1B-1 is a top view of the structure of FIG. 1B, in accordance with some embodiments. FIG. 1B is a cross-sectional view illustrating the structure along a sectional line 1B-1B' in FIG. 1B-1, in accordance with some embodiments. For the sake of simplicity, FIG. 1B-1 omits the underfill layer 170. Similarly, FIGS. 1C-1, 1D-1, 1D-3, 2A, 3A, 4A, 5A-1, 5B-1, 6A-1, 6B-1, 7A-1, and 7B-1 omit the underfill layer 170.

As shown in FIGS. 1B and 1B-1, the chip package P is bonded to a wiring substrate 160 through the solder bumps 150, in accordance with some embodiments. The wiring substrate 160 includes a dielectric layer 162, conductive pads 164, wiring layers 166, and conductive vias 168, in accordance with some embodiments.

The conductive pads 164 are embedded in the dielectric layer 162, in accordance with some embodiments. The solder bumps 150 are bonded to the conductive pads 164, in accordance with some embodiments. The wiring layers 166 and the conductive vias 168 are formed in the dielectric layer 162, in accordance with some embodiments.

The conductive vias 168 are electrically connected between different wiring layers 166 and between the wiring layer 166 and the conductive pads 164, in accordance with some embodiments. For the sake of simplicity, FIG. 1B only shows two of the wiring layers 166, in accordance with some embodiments.

The dielectric layer 162 is made of an insulating material such as a polymer material (e.g., polybenzoxazole or polyimide), nitride (e.g., silicon nitride), oxide (e.g., silicon oxide), silicon oxynitride, or the like, in accordance with some embodiments. The dielectric layer 162 is formed using lamination process (or deposition processes), photolithography processes, and etching processes, in accordance with some embodiments.

The conductive pads 164 are made of a conductive material, such as metal (e.g. copper, aluminum, or tungsten) or alloys thereof, in accordance with some embodiments. The wiring layers 166 are made of a conductive material, such as metal (e.g. copper, aluminum, or tungsten) or alloys thereof, in accordance with some embodiments. The conductive vias 168 are made of a conductive material, such as metal (e.g. copper, aluminum, or tungsten) or alloys thereof, in accordance with some embodiments.

In some embodiments, the conductive pads 164, the wiring layers 166, and the conductive vias 168 are made of the same material. In some other embodiments. the conductive pads 164, the wiring layers 166, and the conductive vias 168 are made of different materials.

As shown in FIGS. 1B and 1B-1, an underfill layer 170 is formed between the chip package P and the wiring substrate 160, in accordance with some embodiments. The underfill layer 170 surrounds the conductive pillars 108, the solder bumps 150 and the chip package P, in accordance with some embodiments. The underfill layer 170 is made of an insulating material, such as a polymer material, in accordance with some embodiments.

In some embodiments, devices (not shown) are bonded to the wiring substrate 160 by, for example, surface mount technology (SMT), in accordance with some embodiments. The devices include passive devices, other suitable devices, or combinations thereof. The passive devices include resistors, capacitors, inductors, or other suitable passive devices.

As shown in FIGS. 1B and 1B-1, an adhesive layer 180 is formed over the wiring substrate 160, in accordance with some embodiments. The adhesive layer 180 has an opening 182, in accordance with some embodiments. The chip package P is in the opening 182, in accordance with some embodiments. The adhesive layer 180 is made of a polymer material such as epoxy or silicone, in accordance with some embodiments.

Figure 1C:
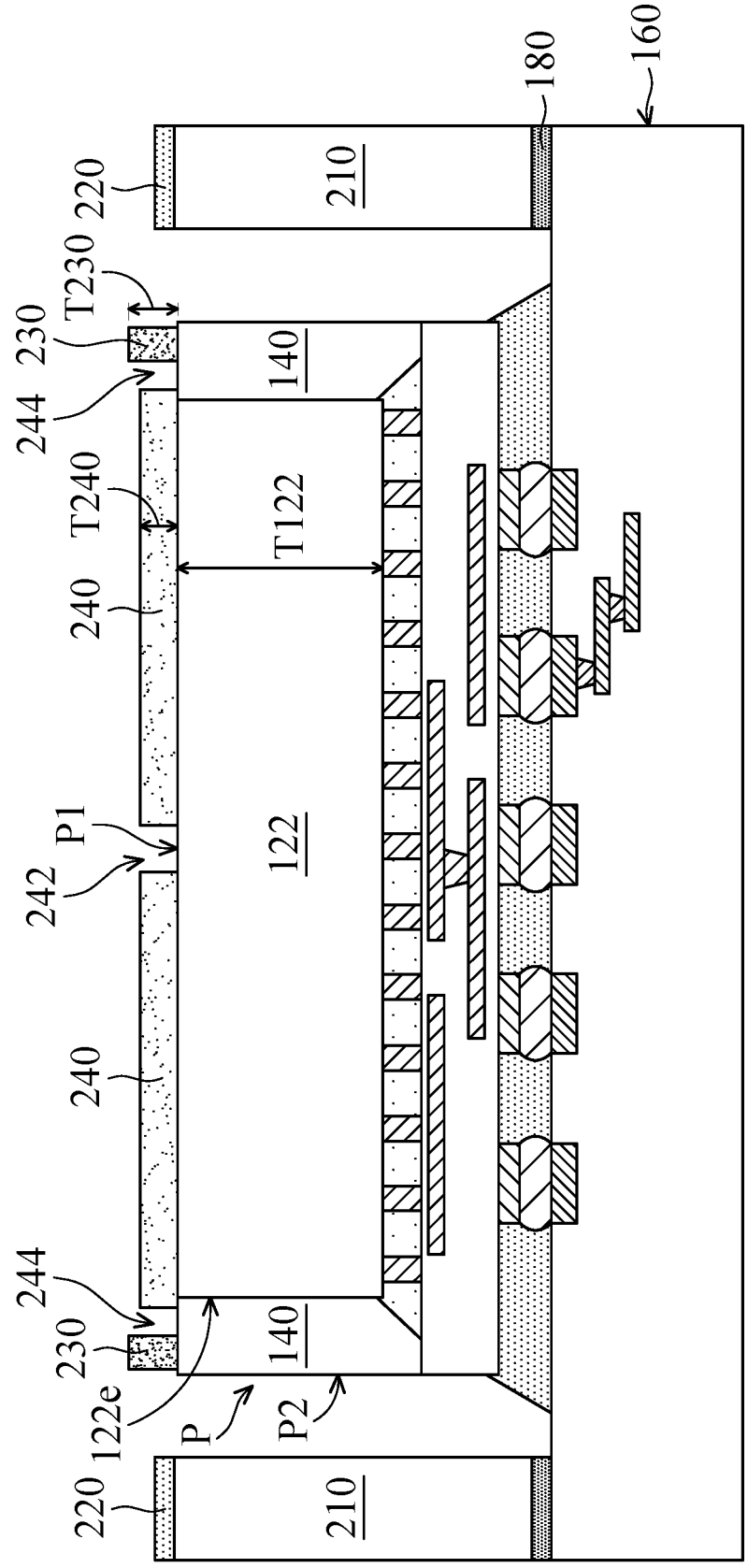
Figures 1, 1C:
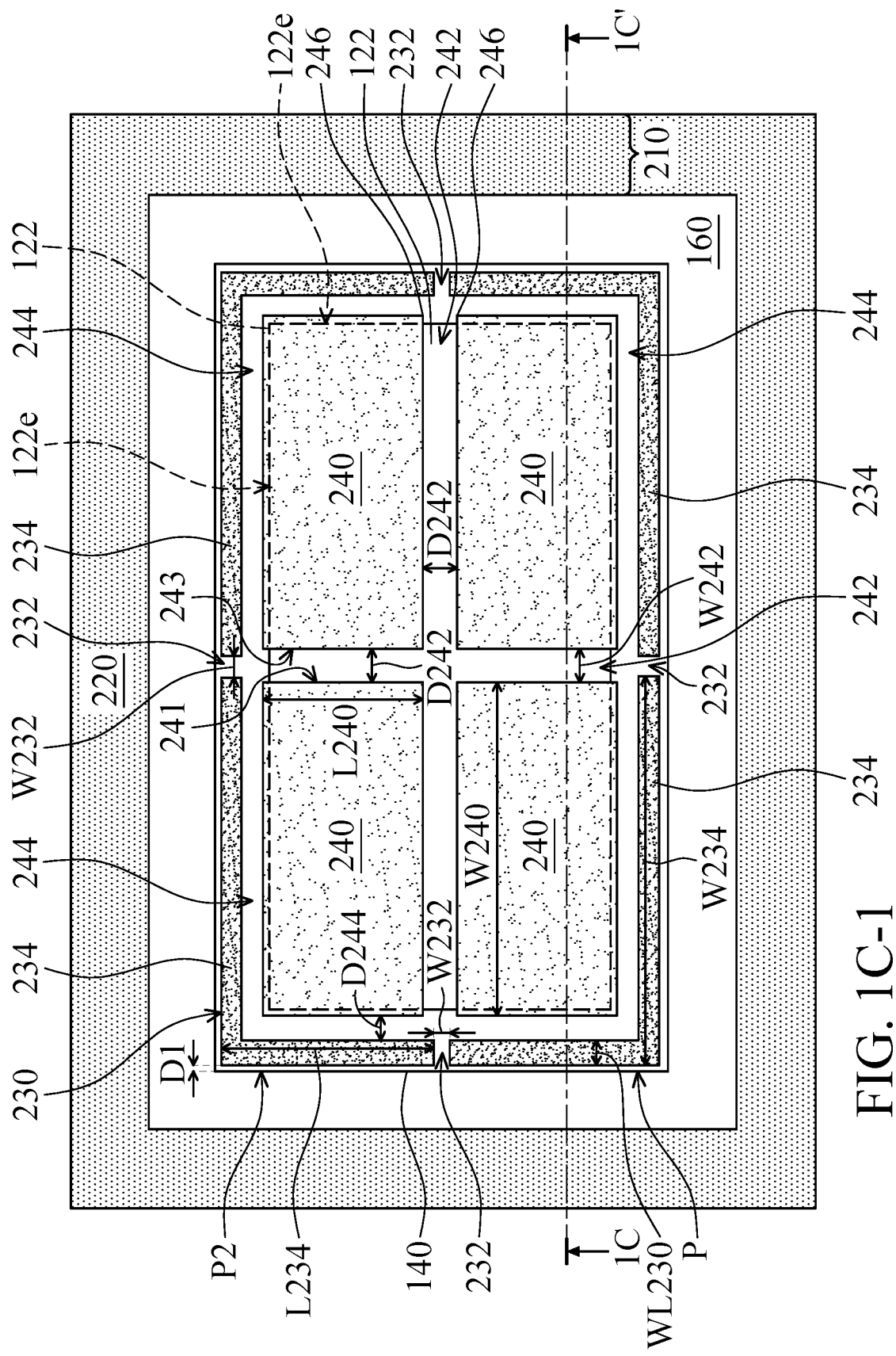

FIG. 1C-1 is a top view of the structure of FIG. 1C, in accordance with some embodiments. FIG. 1C is a cross-sectional view illustrating the structure along a sectional line 1C-1C' in FIG. 1C-1, in accordance with some embodiments. As shown in FIGS. 1C and 1C-1, a ring structure 210 is disposed over the adhesive layer 180, in accordance with some embodiments. The ring structure 210 is made of a rigid material, such as metal (e.g., copper or iron), alloys thereof (e.g., stainless steel), or another suitable material which is more rigid than the wiring substrate 160, in accordance with some embodiments.

As shown in FIGS. 1C and 1C-1, an adhesive layer 220 is formed over the ring structure 210, and a ring dam 230 and heat conductive structures 240 are formed over a top surface P1 of the chip package P, in accordance with some embodiments. The adhesive layer 220 is made of a combination of polymer and metal (e.g., a silver paste) or a polymer (e.g., epoxy or silicone), in accordance with some embodiments.

The ring dam 230 is formed over the molding layer 140, in accordance with some embodiments. The ring dam 230 discontinuously surrounds the heat conductive structures 240, in accordance with some embodiments. The ring dam 230 is used to prevent the heat conductive structures 240 from being squeezed out of the top surface P1 during a subsequent lid bonding process, in accordance with some embodiments.

The ring dam 230 is also used to prevent the heat conductive structures 240 from being squeezed out of the top surface P1 while the chip structure 122 is operating, in accordance with some embodiments. Since the coefficient of thermal expansion (CTE) of the chip structure 122 is less than the CTE of a heat dissipation lid, which is bonded to the chip structure 122 in a subsequent process, the space between the chip structure 122 and the heat dissipation lid becomes smaller while the chip structure 122 is operating (i.e., the temperature is increased), in accordance with some embodiments.

The CTE of the chip structure 122 ranges from about 1 ppm/° C. to about 5 ppm/° C., in accordance with some embodiments. The CTE of the heat dissipation lid ranges from about 15 ppm/° C. to about 20 ppm/° C., in accordance with some embodiments.

As shown in FIG. 1C-1, the ring dam 230 has gaps 232, in accordance with some embodiments. The ring dam 230 is divided into ring segments 234 by the gaps 232, in accordance with some embodiments. The ring segments 234 are separated by the gaps 232, in accordance with some embodiments. The ring segment 234 has a length L234 and a width W234, in accordance with some embodiments.

The length L234 or the width W234 ranges from about 15 μm to about 60 in accordance with some embodiments. The length L234 is greater than the length L240 of the heat conductive structure 240, in accordance with some embodiments. The width W234 is greater than the width W240 of the heat conductive structure 240, in accordance with some embodiments. The length L240 or the width W240 ranges from about 10 μm to about 50 in accordance with some embodiments.

The chip structure 122 has a rectangle shape, in accordance with some embodiments. The sum of the width W232 of the gap 232 and two times of the width W234 of the ring segment 234 is greater than the sum of the width W232 and two times of the length L234 of the ring segment 234, in accordance with some embodiments.

The sum of the width W232 of the gap 232 and two times of the width W234 of the ring segment 234 is greater one hundred times of the width W232, in accordance with some embodiments. The sum of the width W232 and two times of the length L234 of the ring segment 234 is greater one hundred times of the width W232, in accordance with some embodiments. In some embodiments, the gaps 232 have the same width W232. In some other embodiments, the gaps 232 have different widths according to different requirements. The area surrounded by the entire ring dam 230 ranges from about 700 mm$^2$ to about 1000 mm$^2$, in accordance with some embodiments.

The thickness T230 of the ring dam 230 is greater than or equal to the thickness T240 of the heat conductive structure 240, in accordance with some embodiments. Therefore, the ring dam 230 is able to prevent the outflow of the heat conductive structure 240 during a subsequent lid bonding process, in accordance with some embodiments. The thickness T230 ranges from about 50 μm to about 300 μm, in accordance with some embodiments. The thickness T240 ranges from about 50 μm to about 300 μm, in accordance with some embodiments. The thickness T122 of the chip structure 122 is greater than the thickness T230 or T240, in accordance with some embodiments.

The heat conductive structures 240 are formed over the chip structure 122 and the molding layer 140, in accordance with some embodiments. The heat conductive structures 240 extend across edges 122e of the chip structure 122, in accordance with some embodiments. The heat conductive structures 240 are separated by gaps 242, in accordance with some embodiments. The heat conductive structures 240 and the ring dam 230 are separated by gaps 244, in accordance with some embodiments.

As shown in FIG. 1C-1, in some embodiments, one of the gaps 242 is between two of the gaps 232 of the ring dam 230. The one of the gaps 242 extends toward the two of the gaps 232, in accordance with some embodiments. The gaps 232 communicate with the gaps 242 and 244, in accordance with some embodiments. The gaps 232 of the ring dam 230 are adjacent to corners 246 of the heat conductive structures 240, in accordance with some embodiments.

In some embodiments, one of two adjacent heat conductive structures 240 has a sidewall 241, and the other one of the two adjacent heat conductive structures 240 has a sidewall 243. The sidewalls 241 and 243 face each other, in accordance with some embodiments. The sidewall 241 is parallel to the sidewall 243, in accordance with some embodiments.

The width W232 of the gap 232 is less than the width W242 of the gap 242, which may prevent the heat conductive structures 240 from flowing out of the gap 232 or reduce the amount of the heat conductive structures 240 flowing out of the gap 232. In some embodiments, the heat conductive structures 240 are spaced apart from each other by substantially the same distances D242. In some other embodiments, the heat conductive structures 240 are spaced apart from each other by different distances according to different requirements.

The heat conductive structure 240 and the ring dam 230 are spaced apart from each other by a distance D244, in accordance with some embodiments. The ring dam 230 and an edge P2 of the chip package P are spaced apart from each other by a distance D1, in accordance with some embodiments. In some embodiments, the distance D244 is substantially equal to a sum of the distance D1 and one-half the distance D242.

The ring dam 230 and the heat conductive structures 240 are made of different materials, in accordance with some embodiments. The ring dam 230 is made of an elastic material and/or an adhesive material such as a polymer material or a combination of polymer and metal (e.g., a silver paste), in accordance with some embodiments. The polymer material includes epoxy, polyimide (PI), polyethylene (PE), rubber, or silicone, in accordance with some embodiments. The ring dam 230 is formed using a dispensing process, in accordance with some embodiments.

The heat conductive structures 240 include metal foils, in accordance with some embodiments. The heat conductive structures 240 are made of a heat conductive material such as indium (In), tin (Sn), or an appropriate material with a good thermal conductivity and thermal diffusivity, in accordance with some embodiments. The material of the heat conductive structures 240 has a thermal conductivity greater than or equal to 50 W/(m·K), in accordance with some embodiments. The thermal conductivity of the material of the heat conductive structures 240 is greater than that of the ring dam 230, in accordance with some embodiments.

Figure 1D:
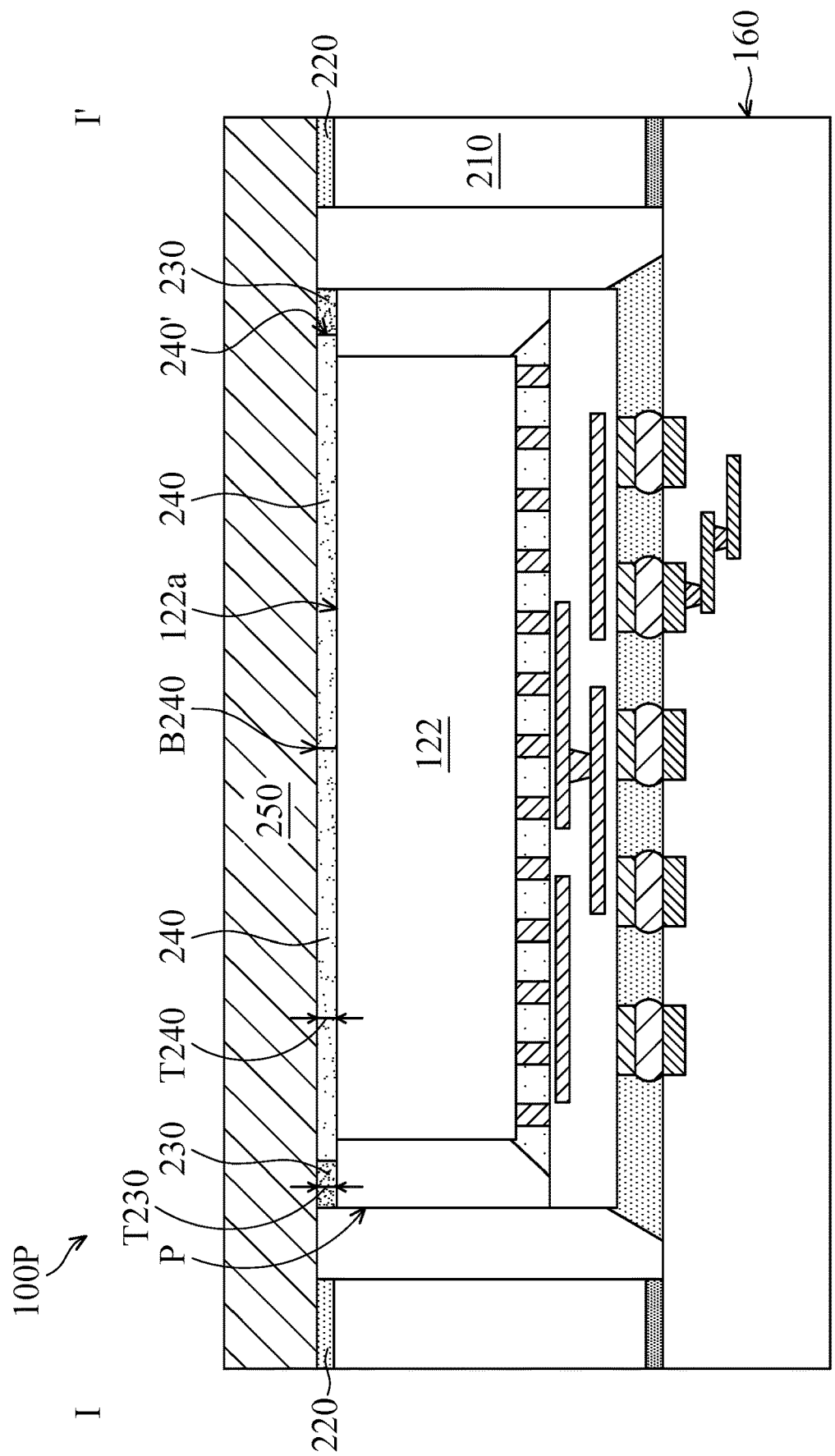
Figures 1, 1D:
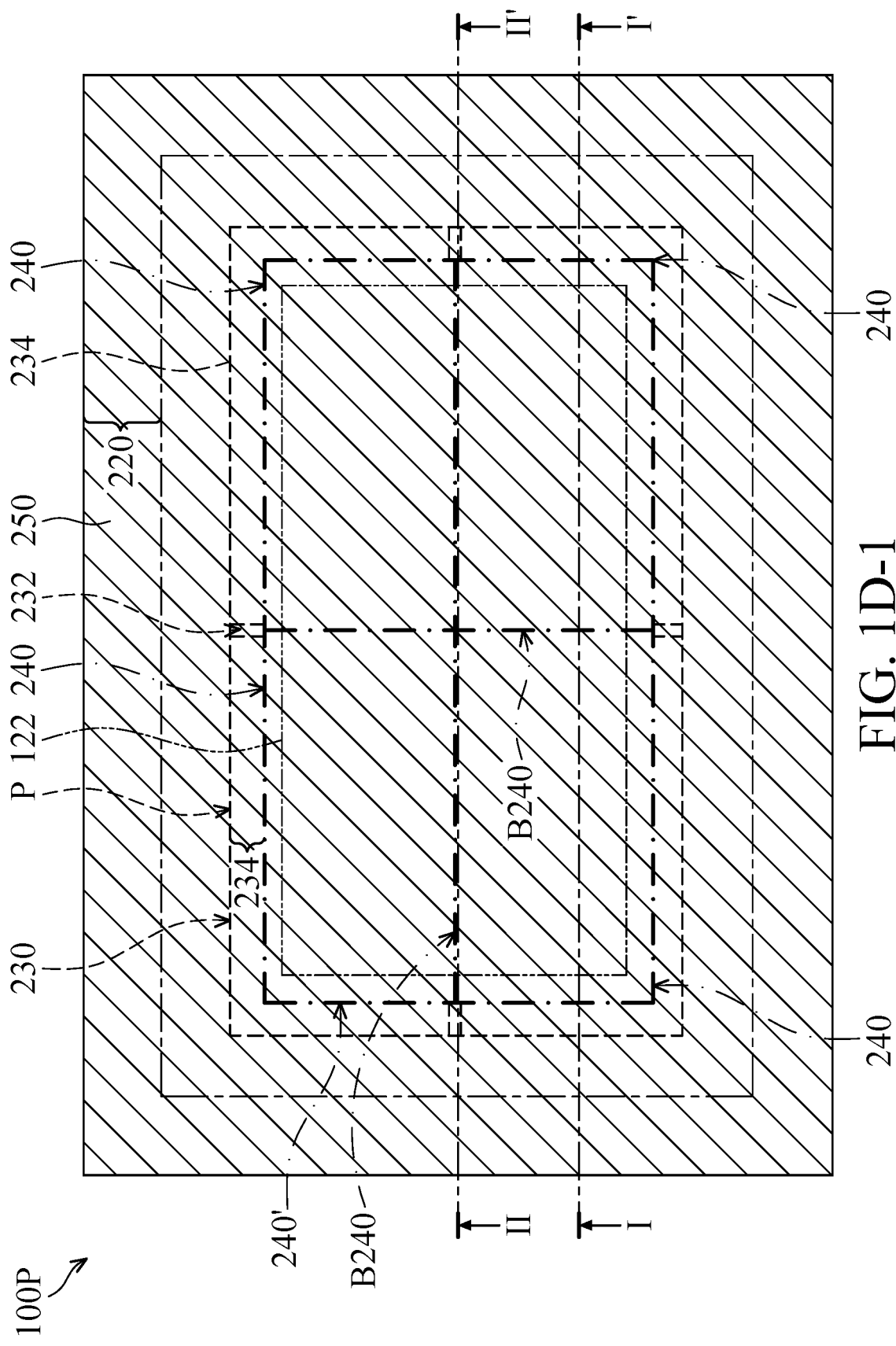
Figures 1, 1D, 2:
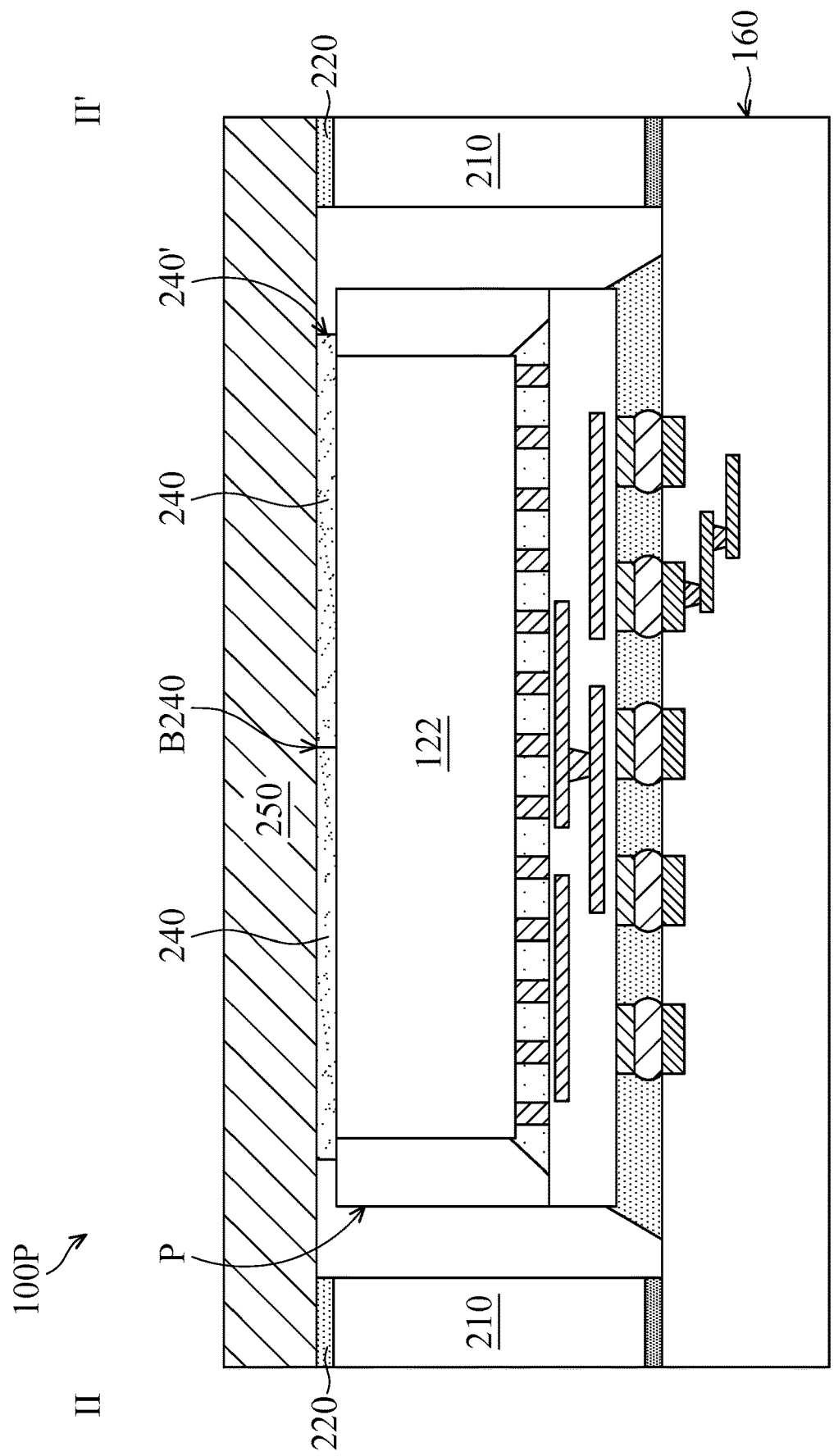
Figures 1, 1D, 2, 3:
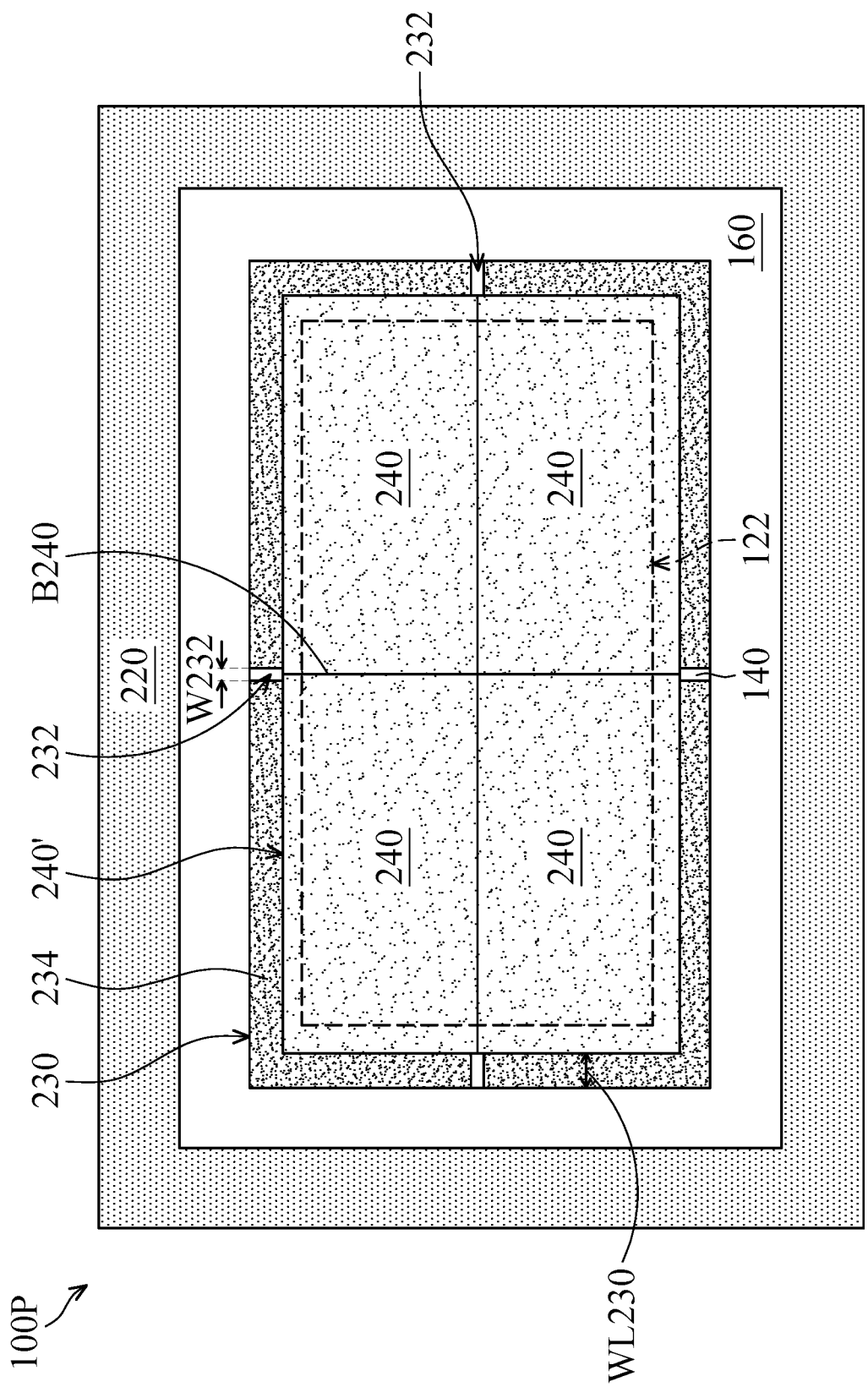

FIG. 1D-1 is a top view of the structure of FIG. 1D, in accordance with some embodiments. FIG. 1D is a cross-sectional view illustrating the chip package structure along a sectional line I-I' in FIG. 1D-1, in accordance with some embodiments. FIG. 1D-2 is a cross-sectional view illustrating the chip package structure along a sectional line II-IF in FIG. 1D-1, in accordance with some embodiments. FIG. 1D-3 is a top view of the structure of FIG. 1D, except the heat dissipation lid, in accordance with some embodiments.

As shown in FIGS. 1D and 1D-1, the heat dissipation lid 250 is disposed over the heat conductive structures 240, the ring dam 230, and the adhesive layer 220, and an annealing process is performed to soften the heat conductive structures 240, the ring dam 230, and the adhesive layer 220, in accordance with some embodiments.

The heat dissipation lid 250 is bonded to the chip package P through the heat conductive structures 240, the ring dam 230, and the adhesive layer 220, in accordance with some embodiments. In some embodiments, the thickness T230 of the ring dam 230 is substantially equal to the thickness T240 of the heat conductive structure 240 after the annealing process. In this step, a chip package structure 100P is substantially formed, in accordance with some embodiments. The temperature of the annealing process ranges from about 100° C. to about 150° C., in accordance with some embodiments.

As shown in FIGS. 1D and 1D-3, during the annealing process, the heat conductive structures 240 extend toward each other until the heat conductive structures 240 contact each other, and the heat conductive structures 240 and the ring dam 230 extend toward each other until the heat conductive structures 240 contact the ring dam 230, in accordance with some embodiments.

Therefore, the sizes (e.g., widths and lengths) of the heat conductive structures 240 and the ring dam 230 become larger after the annealing process, in accordance with some embodiments. As shown in FIGS. 1C-1 and 1D-3, the linewidth WL230 of the ring dam 230 becomes larger after the annealing process, in accordance with some embodiments.

The heat conductive structures 240 together form a heat conductive layer 240', in accordance with some embodiments. The heat conductive layer 240' covers the entire top surface 122a of the chip structure 122, in accordance with some embodiments.

As shown in FIGS. 1C-1 and 1D-3, during the annealing process, the sizes of the gaps 242 and 244 between the heat conductive structures 240 and the ring dam 230 gradually diminish, until the gaps 242 and 244 substantially disappear, in accordance with some embodiments. Similarly, the widths W232 of the gaps 232 become smaller after the annealing process, in accordance with some embodiments.

The air originally in the gaps 242 and 244 flows out through the gaps 232 of the ring dam 230, in accordance with some embodiments. Therefore, the gaps 232 are able to prevent the formation of voids in the annealed heat conductive structures 240, which improves the heat dissipation efficiency of the chip package structure 100P, in accordance with some embodiments. As a result, the life span of the chip package structure 100P is increased, in accordance with some embodiments.

There are boundaries B240 between the heat conductive structures 240, in accordance with some embodiments. The boundaries B240 are also referred to as edges of the heat conductive structures 240, in accordance with some embodiments. The boundaries B240 extend toward the gaps 232 of the ring dam 230, in accordance with some embodiments.

The heat dissipation lid 250 is made of a high thermal conductivity material, such as a metal material (aluminum or copper), an alloy material (e.g., stainless steel), or aluminum-silicon carbide (AlSiC), in accordance with some embodiments.

Figure 2A:
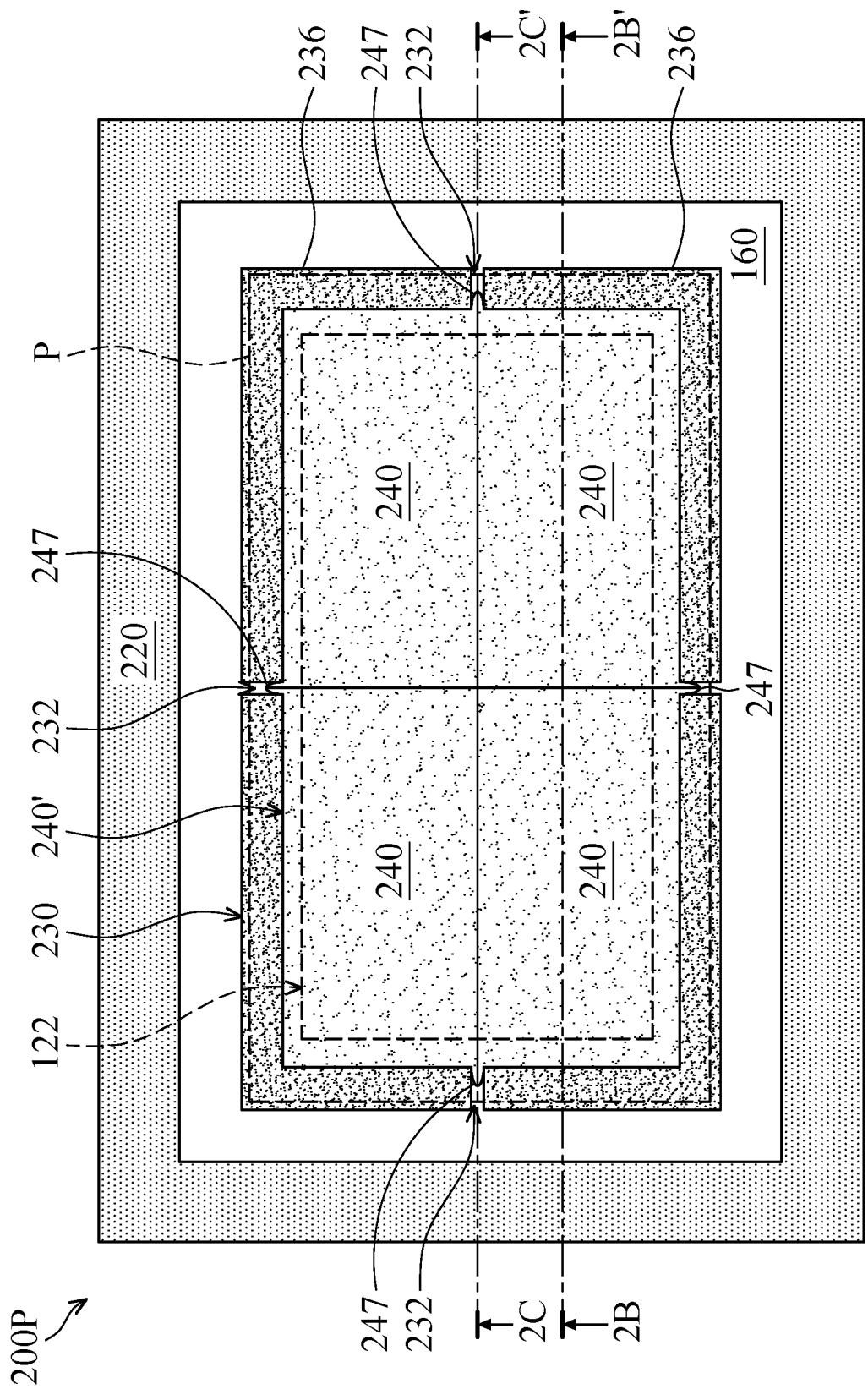
FIG. 2A is a top view of a chip package structure, in accordance with some embodiments.
Figure 2B:
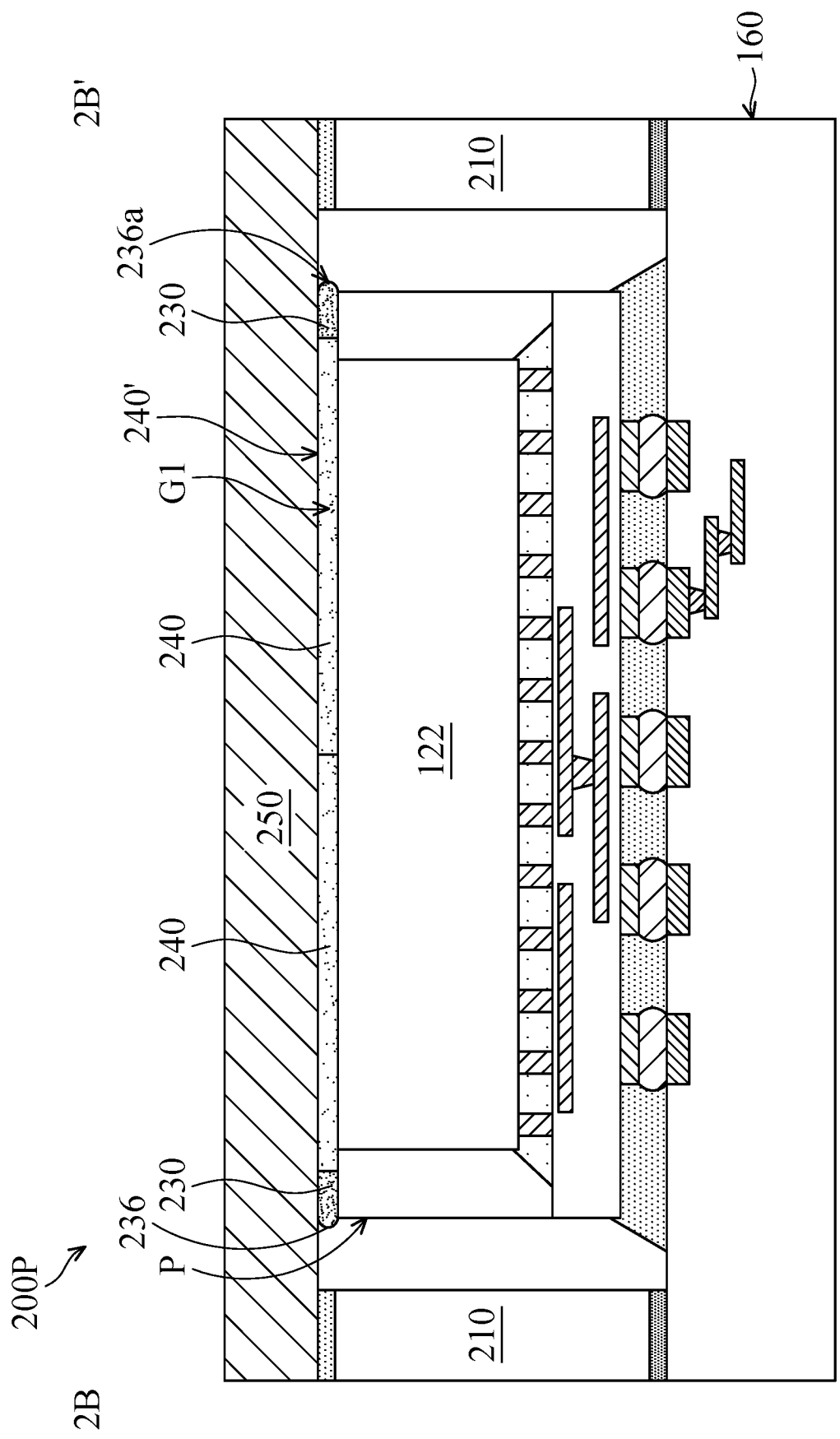
FIG. 2B is a cross-sectional view illustrating the chip package structure along a sectional line 2B-2B' in FIG. 2A, in accordance with some embodiments.
Figure 2C:
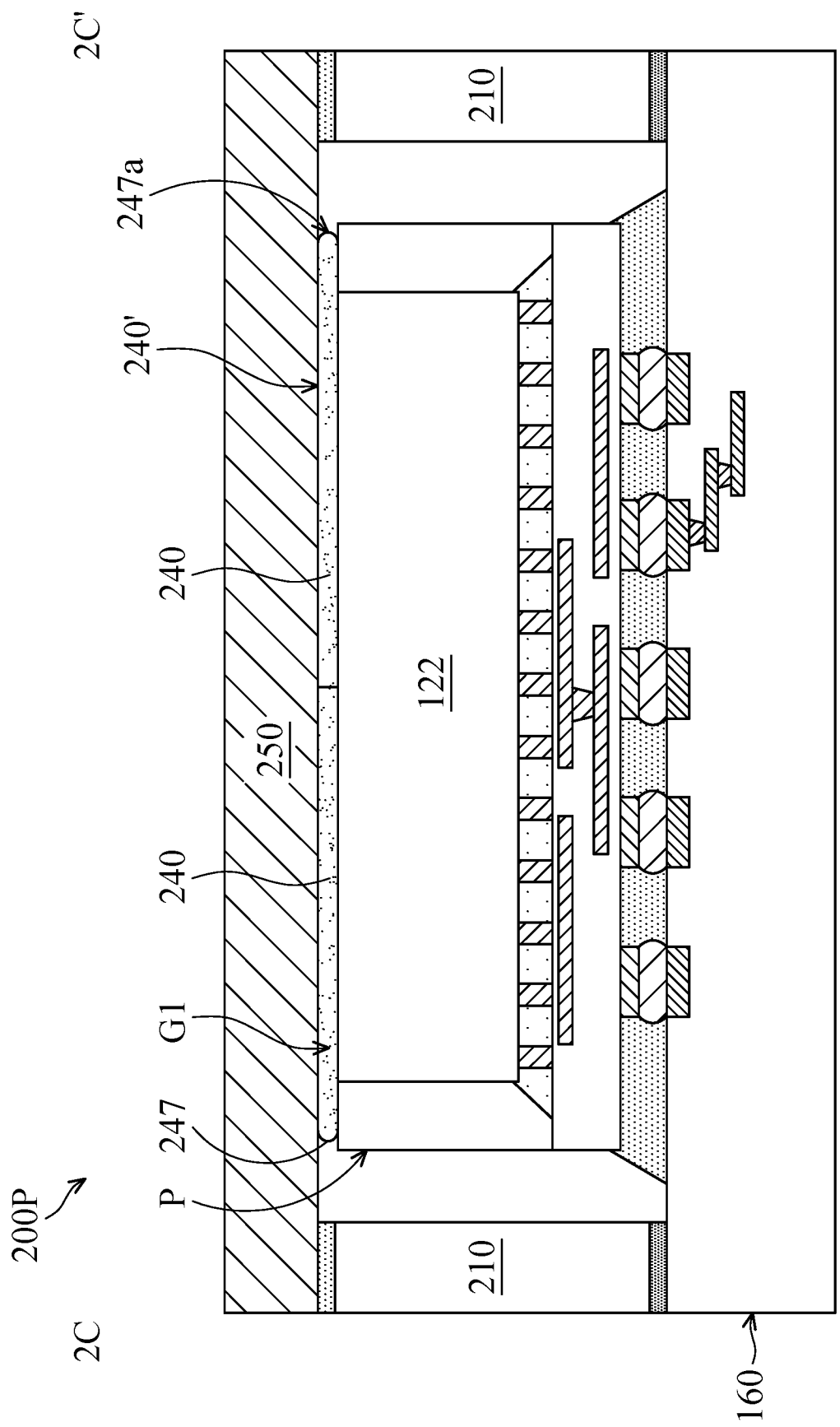
FIG. 2C is a cross-sectional view illustrating the chip package structure along a sectional line 2C-2C' in FIG. 2A, in accordance with some embodiments.

FIG. 2A is a top view of a chip package structure 200P, in accordance with some embodiments. For the sake of simplicity, FIG. 2A omits a heat dissipation lid of the chip package structure 200P, in accordance with some embodiments. FIG. 2B is a cross-sectional view illustrating the chip package structure 200P along a sectional line 2B-2B' in FIG. 2A, in accordance with some embodiments. FIG. 2C is a cross-sectional view illustrating the chip package structure 200P along a sectional line 2C-2C' in FIG. 2A, in accordance with some embodiments.

As shown in FIGS. 2A, 2B and 2C, the chip package structure 200P is similar to the chip package structure 100P of FIG. 1D, except that portions 247 of the heat conductive structures 240 extend into the gaps 232 of the ring dam 230 and portions 236 of the ring dam 230 protrude out of the gap G1 between the heat dissipation lid 250 and the chip package P, in accordance with some embodiments.

As shown in FIGS. 2A and 2B, the portions 236 have curved sidewalls 236a, in accordance with some embodiments. As shown in FIGS. 2A and 2C, the portions 247 have curved sidewalls 247a, in accordance with some embodiments.

Figure 3A:
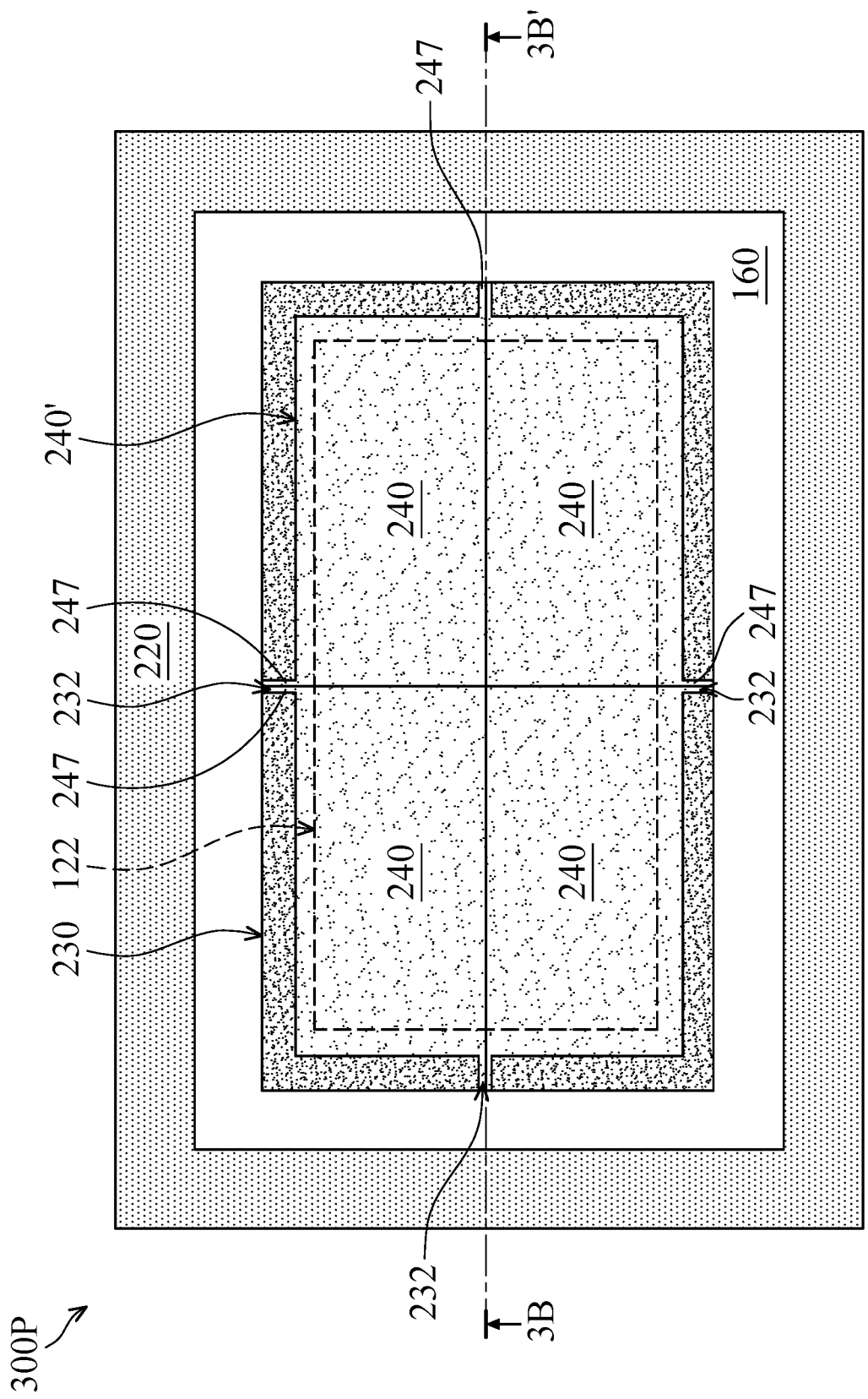
FIG. 3A is a top view of a chip package structure, in accordance with some embodiments.
Figure 3B:
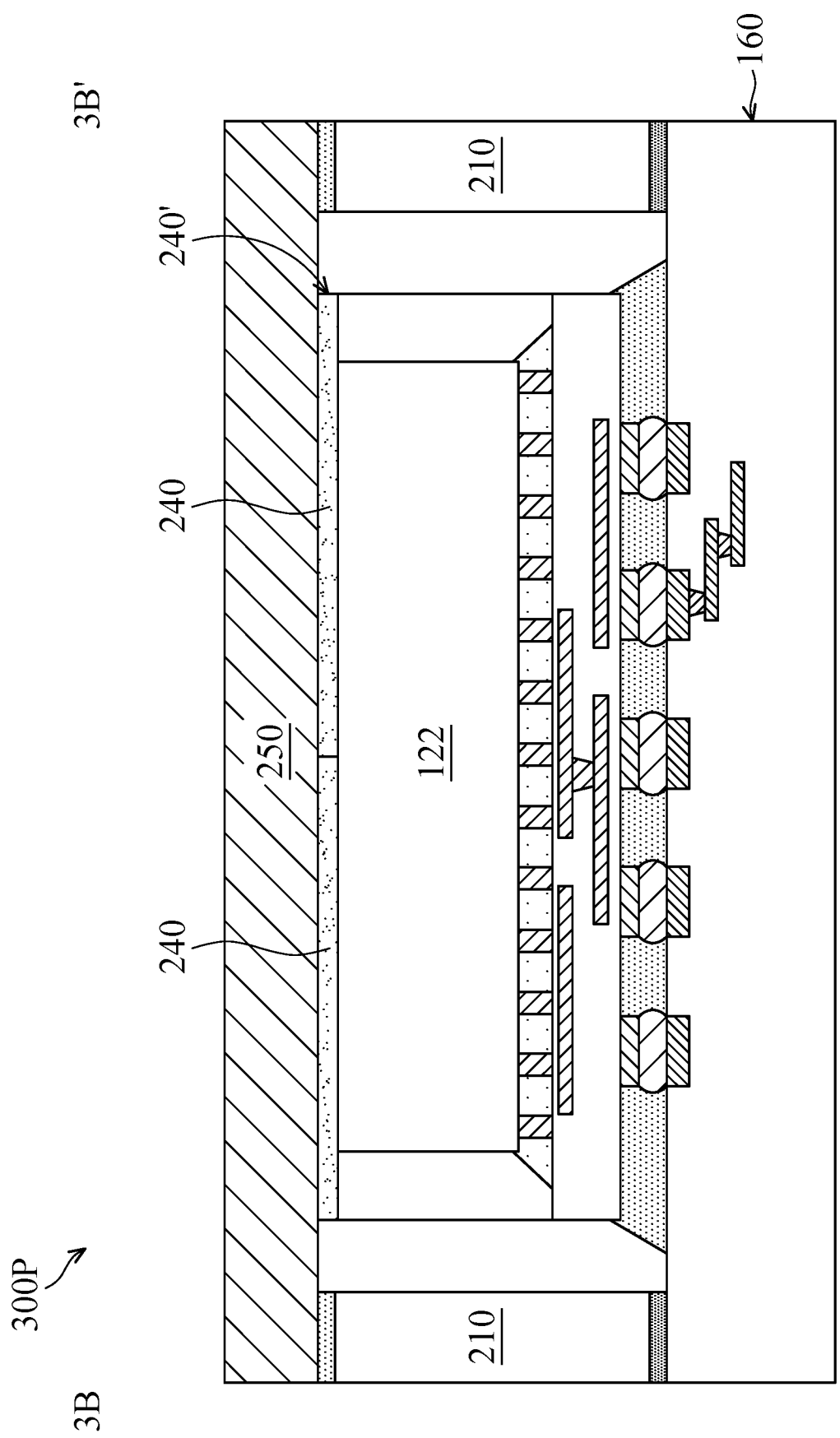
FIG. 3B is a cross-sectional view illustrating the chip package structure along a sectional line 3B-3B' in FIG. 3A, in accordance with some embodiments.

FIG. 3A is a top view of a chip package structure 300P, in accordance with some embodiments. For the sake of simplicity, FIG. 3A omits a heat dissipation lid of the chip package structure 300P, in accordance with some embodiments. FIG. 3B is a cross-sectional view illustrating the chip package structure 300P along a sectional line 3B-3B' in FIG. 3A, in accordance with some embodiments.

As shown in FIGS. 3A and 3B, the chip package structure 300P is similar to the chip package structure 200P of FIG. 2A, except that the gaps 232 of the ring dam 230 are filled up with the portions 247 of the heat conductive structures 240, in accordance with some embodiments.

Figure 4A:
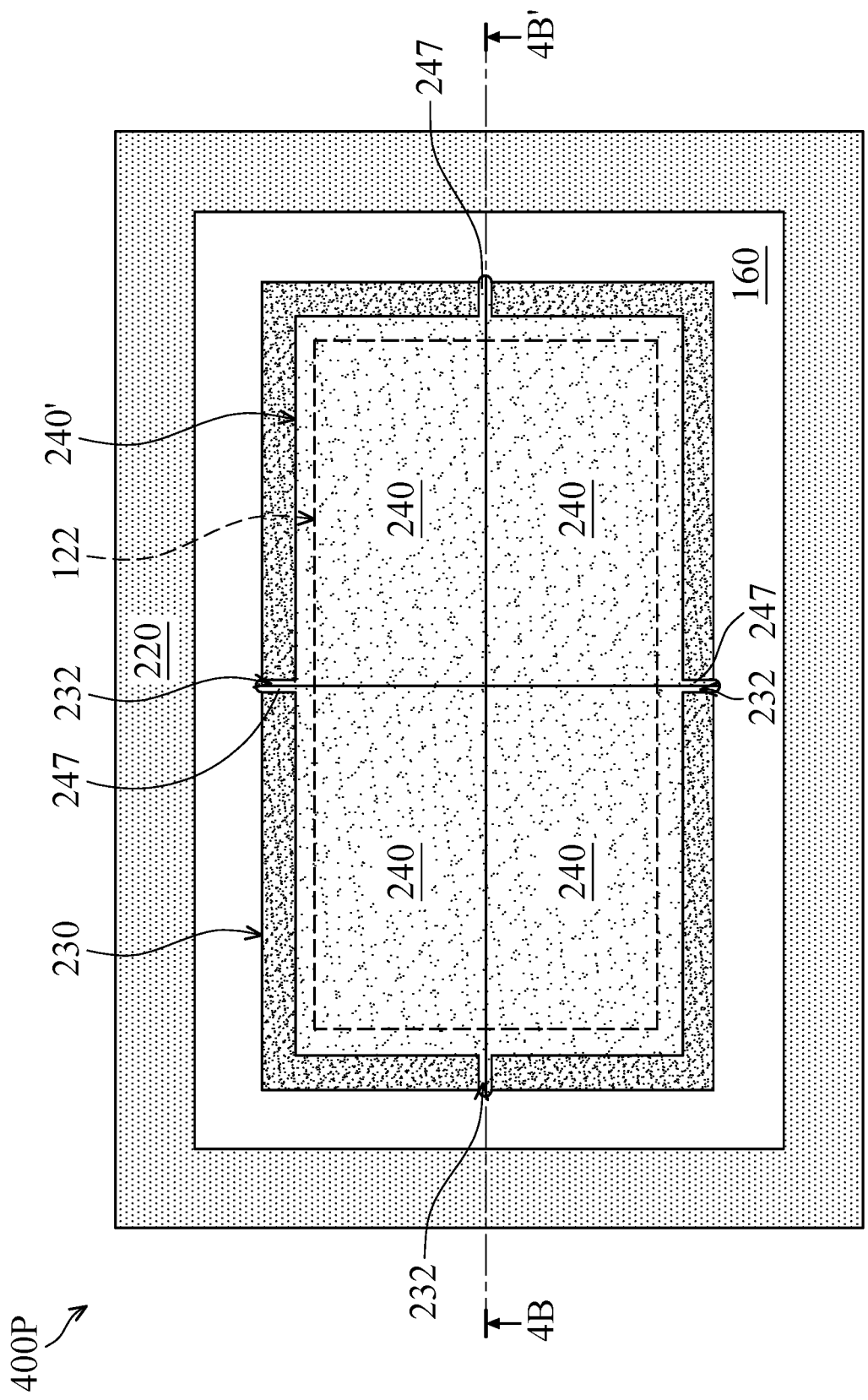
FIG. 4A is a top view of a chip package structure, in accordance with some embodiments.
Figure 4B:
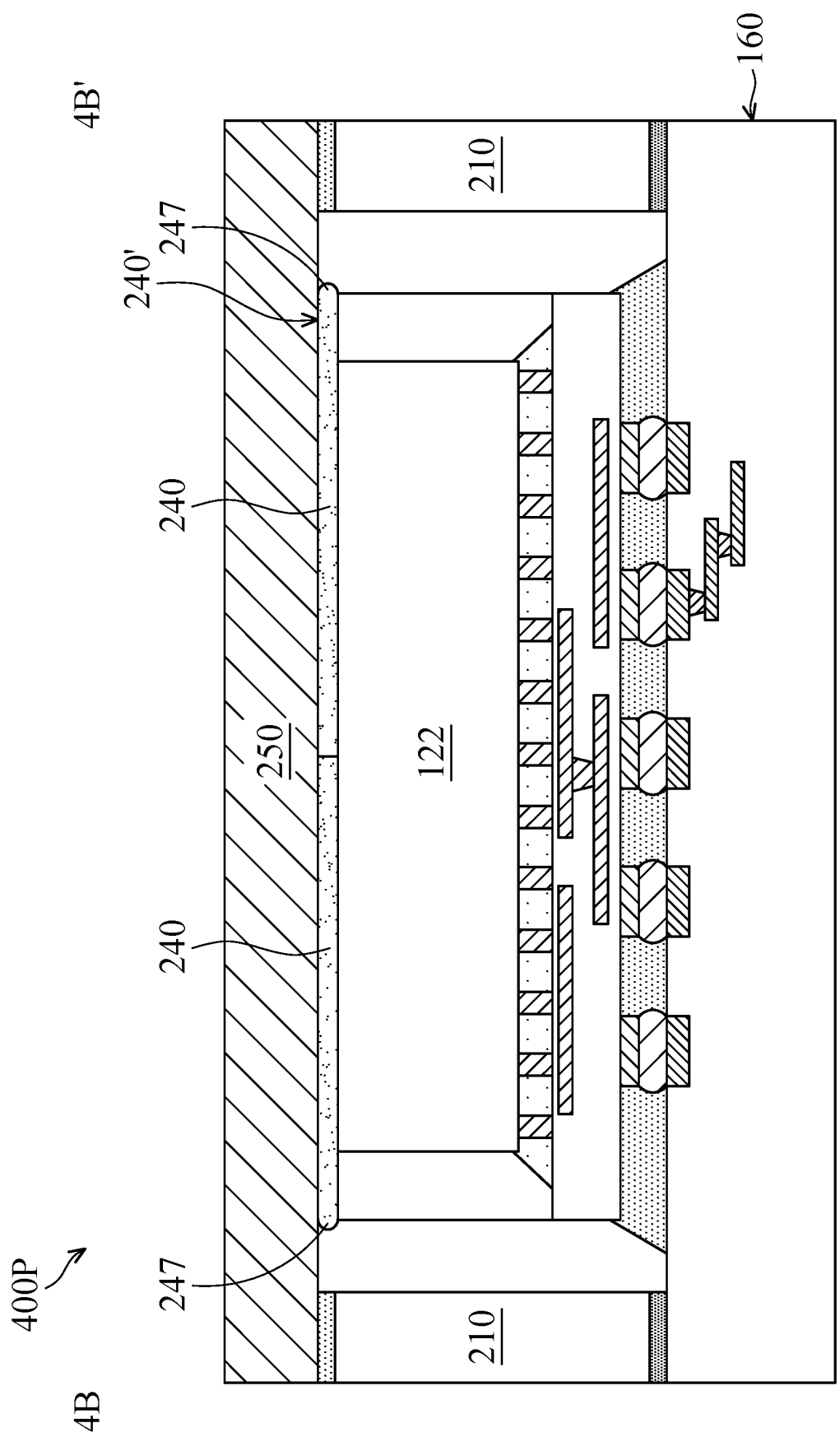
FIG. 4B is a cross-sectional view illustrating the chip package structure along a sectional line 4B-4B' in FIG. 4A, in accordance with some embodiments.

FIG. 4A is a top view of a chip package structure 400P, in accordance with some embodiments. For the sake of simplicity, FIG. 4A omits a heat dissipation lid of the chip package structure 400P, in accordance with some embodiments. FIG. 4B is a cross-sectional view illustrating the chip package structure 400P along a sectional line 4B-4B' in FIG. 4A, in accordance with some embodiments. As shown in FIGS. 4A and 4B, the chip package structure 400P is similar to the chip package structure 300P of FIG. 3A, except that the portions 247 of the heat conductive structures 240 extend out of the gaps 232 of the ring dam 230, in accordance with some embodiments.

Figure 5A:
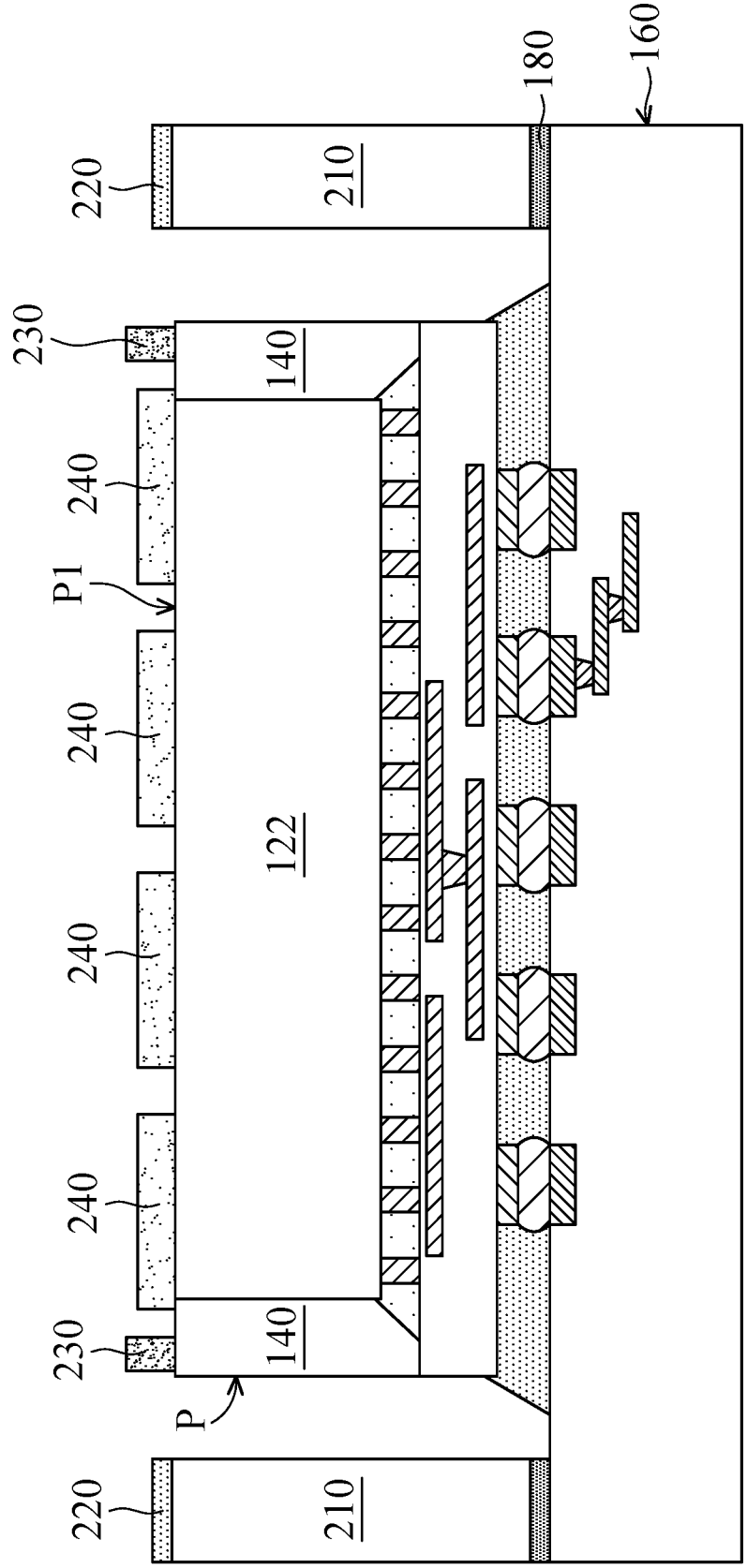
FIG. 5A is a cross-sectional view of various stages of a process for forming a chip package structure, in accordance with some embodiments.
Figures 1, 5A:
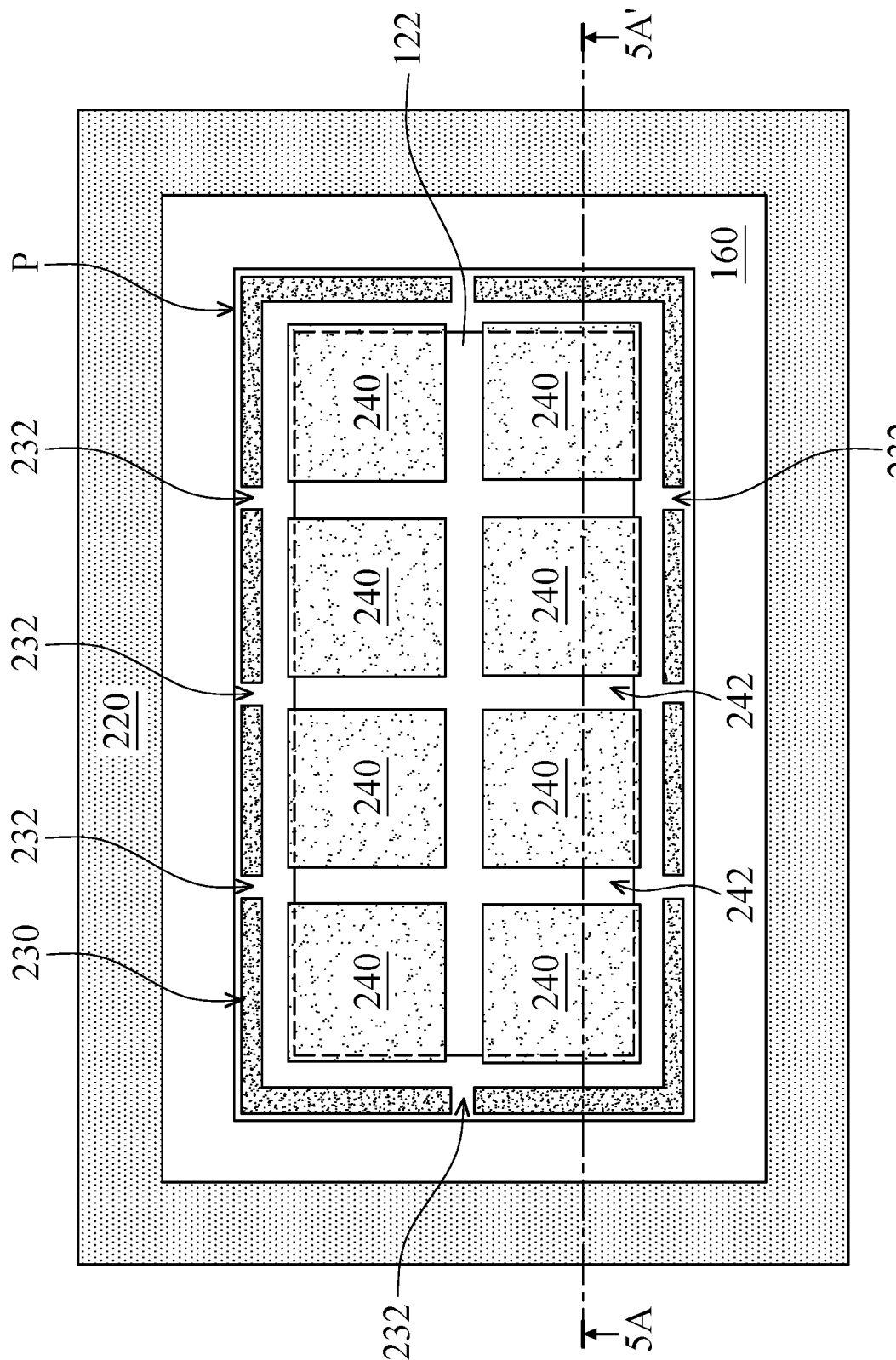
Figure 5B:
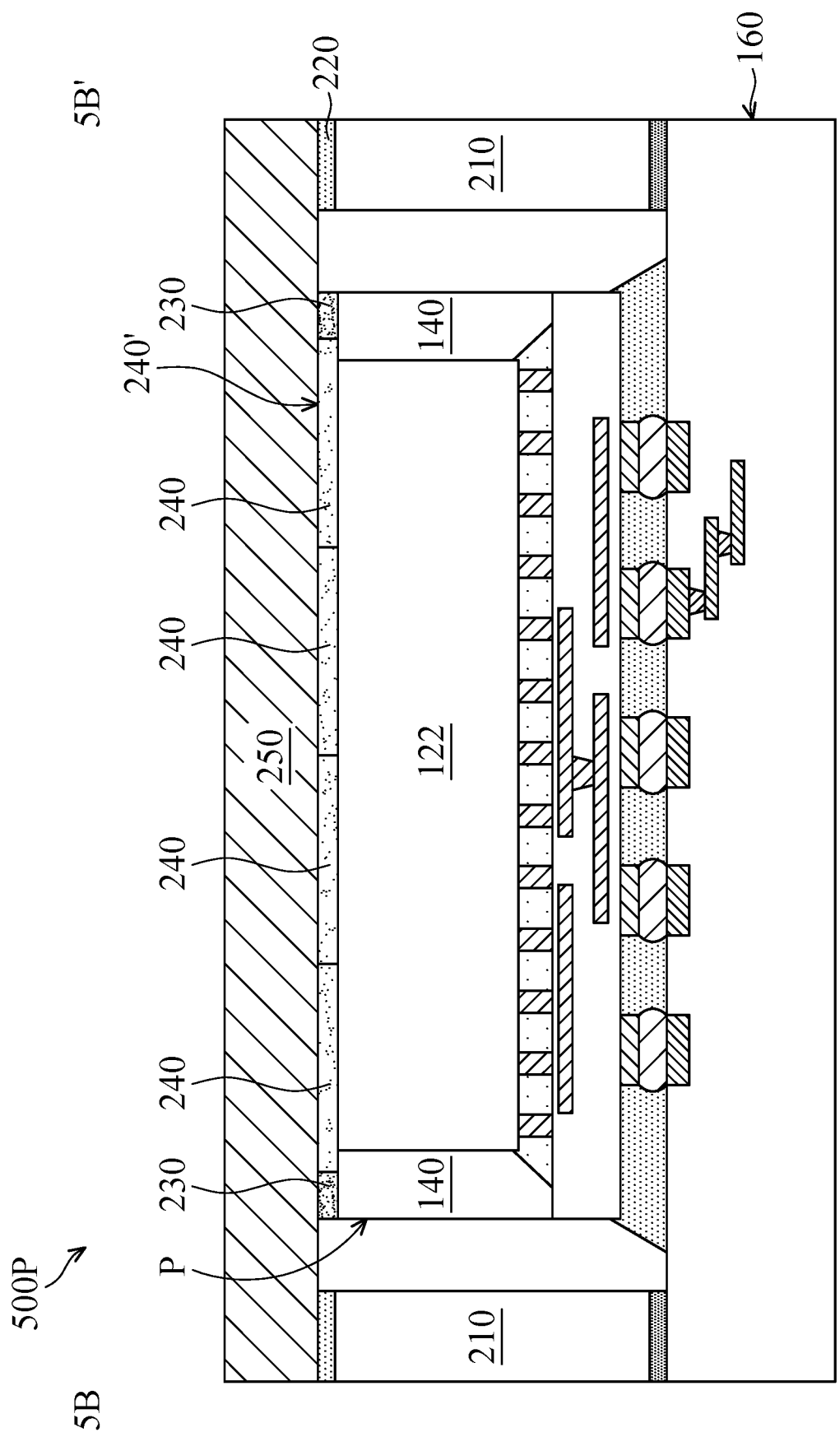
FIG. 5B is a cross-sectional view of various stages of a process for forming a chip package structure, in accordance with some embodiments.
Figures 1, 5B:
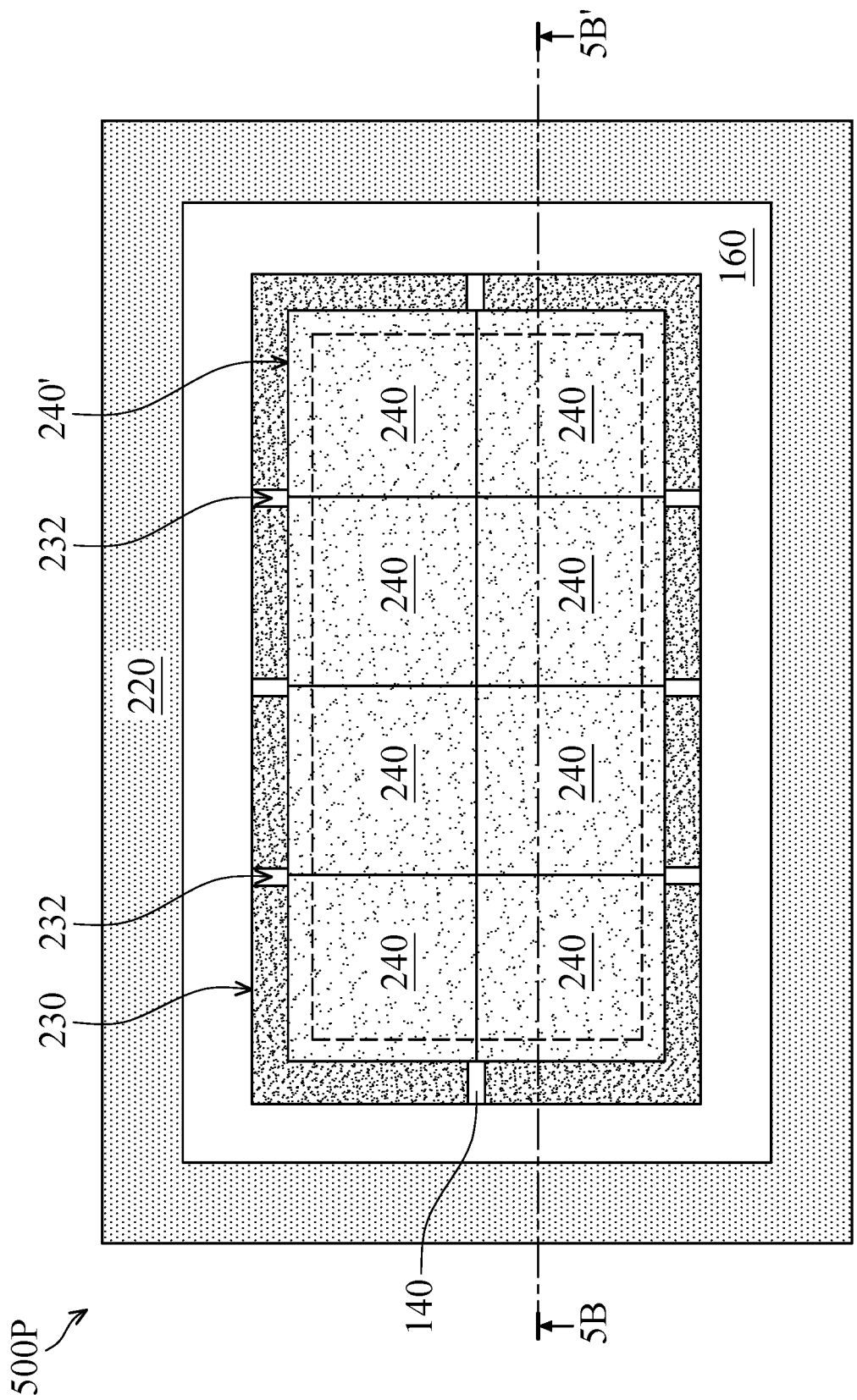

FIGS. 5A-5B are cross-sectional views of various stages of a process for forming a chip package structure, in accordance with some embodiments. FIG. 5A-1 is a top view of the structure of FIG. 5A, in accordance with some embodiments. FIG. 5A is a cross-sectional view illustrating the structure along a sectional line 5A-5A' in FIG. 5A-1, in accordance with some embodiments.

As shown in FIGS. 5A and 5A-1, after the step of FIG. 1B, a ring structure 210 is disposed over the adhesive layer 180, an adhesive layer 220 is formed over the ring structure 210, and a ring dam 230 and heat conductive structures 240 are formed over a top surface P1 of the chip package P, in accordance with some embodiments.

The heat conductive structures 240 have a square shape, in accordance with some embodiments. The heat conductive structures 240 are arranged in an array, in accordance with some embodiments. The ring dam 230 has gaps 232, in accordance with some embodiments. The heat conductive structures 240 are separated by gaps 242, in accordance with some embodiments. The gaps 242 extend toward the gaps 232, in accordance with some embodiments.

FIG. 5B-1 is a top view of the structure of FIG. 5B, in accordance with some embodiments. For the sake of simplicity, FIG. 5B-1 omits the heat dissipation lid of the structure of FIG. 5B, in accordance with some embodiments. FIG. 5B is a cross-sectional view illustrating the structure along a sectional line 5B-5B' in FIG. 5B-1, in accordance with some embodiments.

As shown in FIGS. 5B and 5B-1, the heat dissipation lid 250 is disposed over the heat conductive structures 240, the ring dam 230, and the adhesive layer 220, and an annealing process is performed to soften the heat conductive structures 240, the ring dam 230, and the adhesive layer 220, in accordance with some embodiments. The heat dissipation lid 250 is bonded to the chip package P through the heat conductive structures 240, the ring dam 230, and the adhesive layer 220, in accordance with some embodiments. In this step, a chip package structure 500P is substantially formed, in accordance with some embodiments.

Figure 6A:
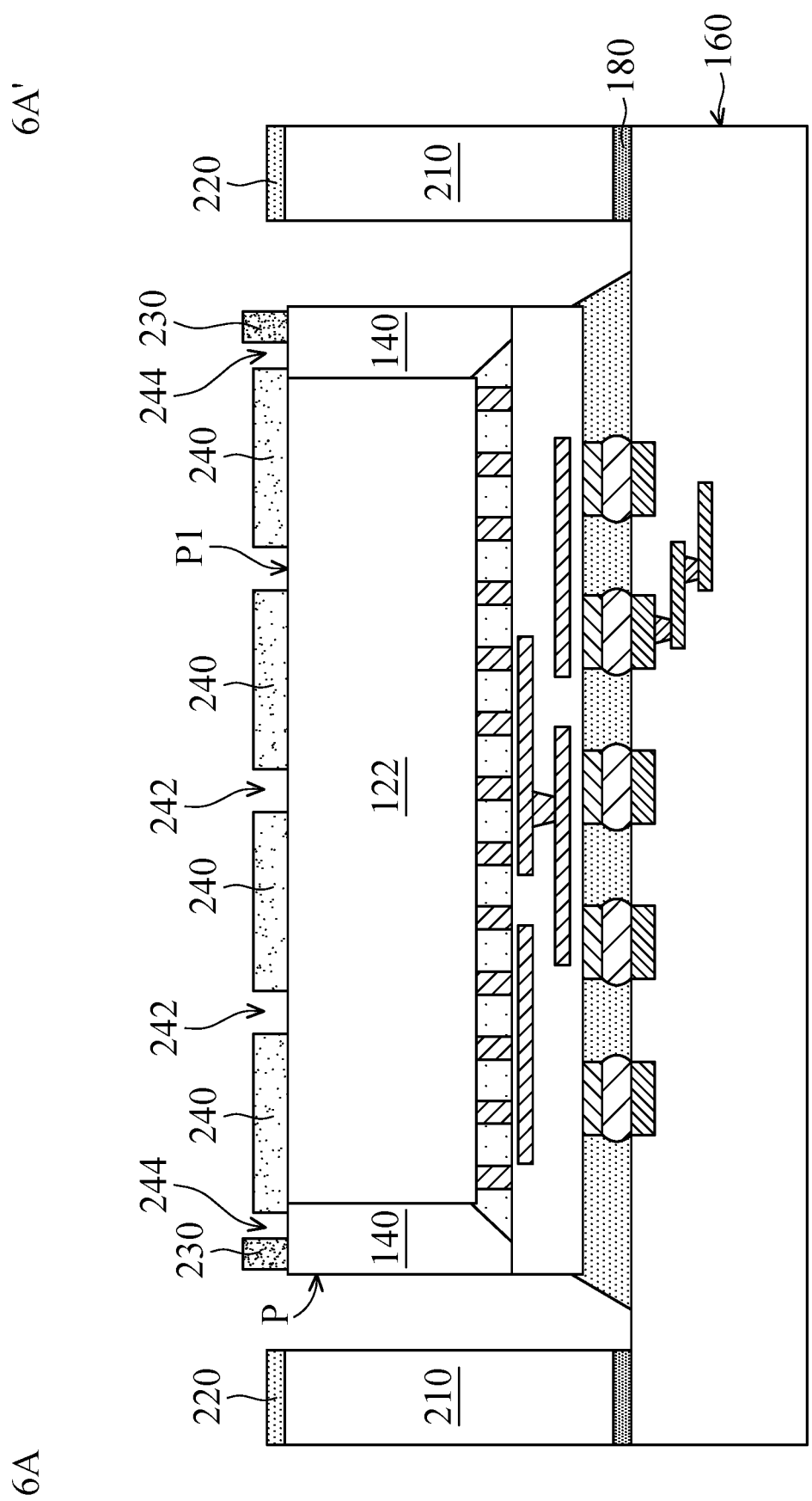
FIG. 6A is a cross-sectional view of various stages of a process for forming a chip package structure, in accordance with some embodiments.
Figures 1, 6A:
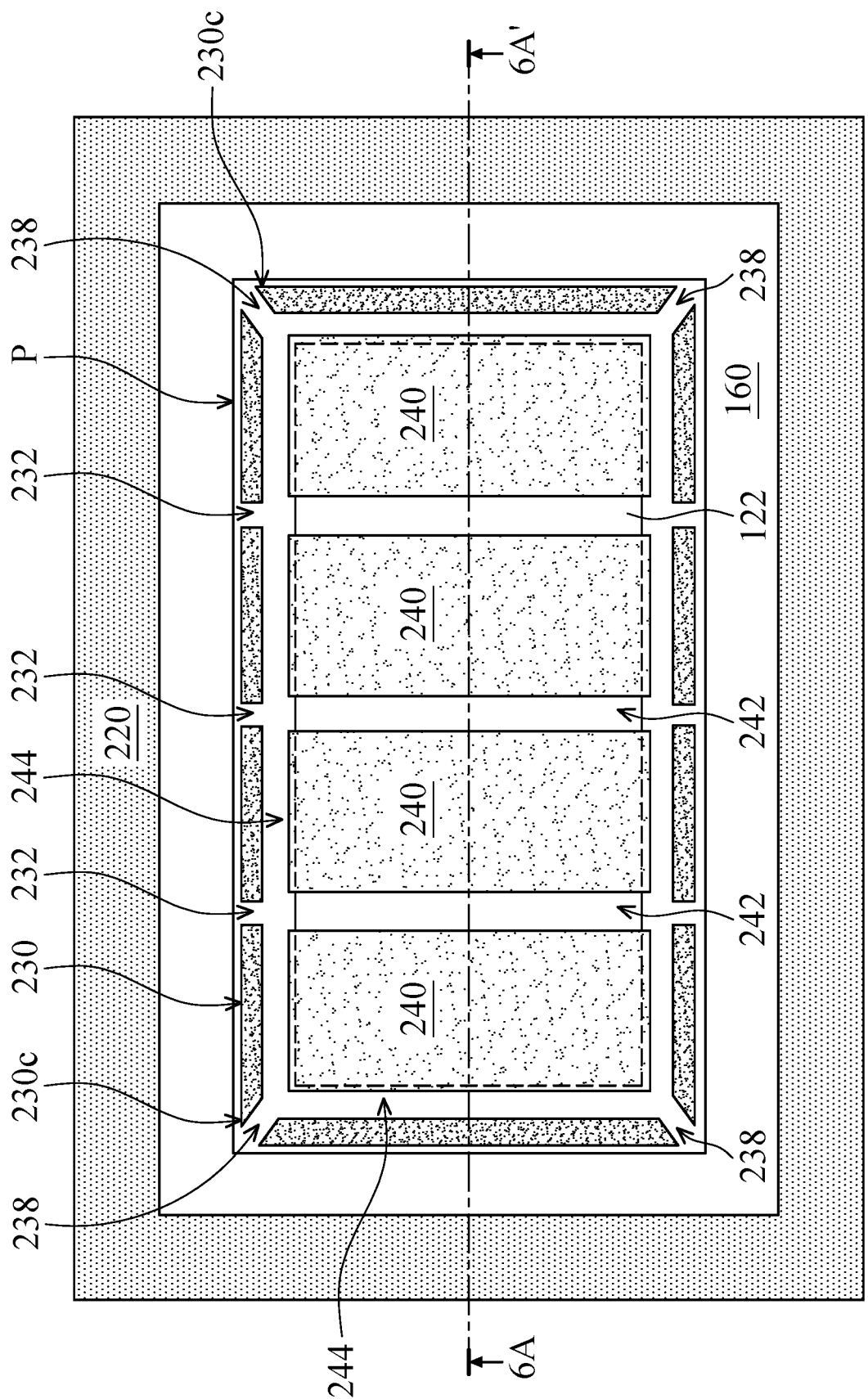
Figure 6B:
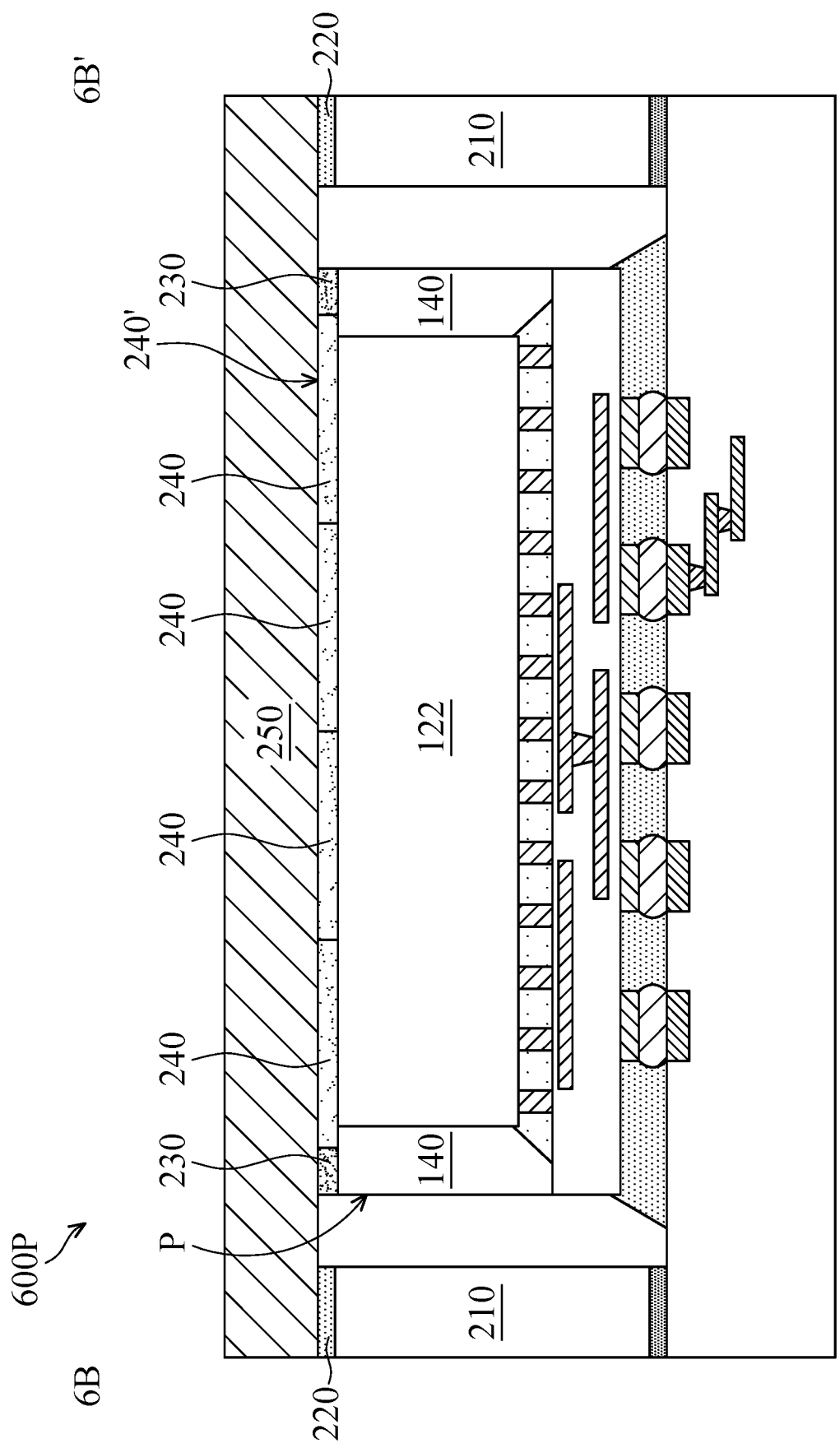
FIG. 6B is a cross-sectional view of various stages of a process for forming a chip package structure, in accordance with some embodiments.
Figures 1, 6B:
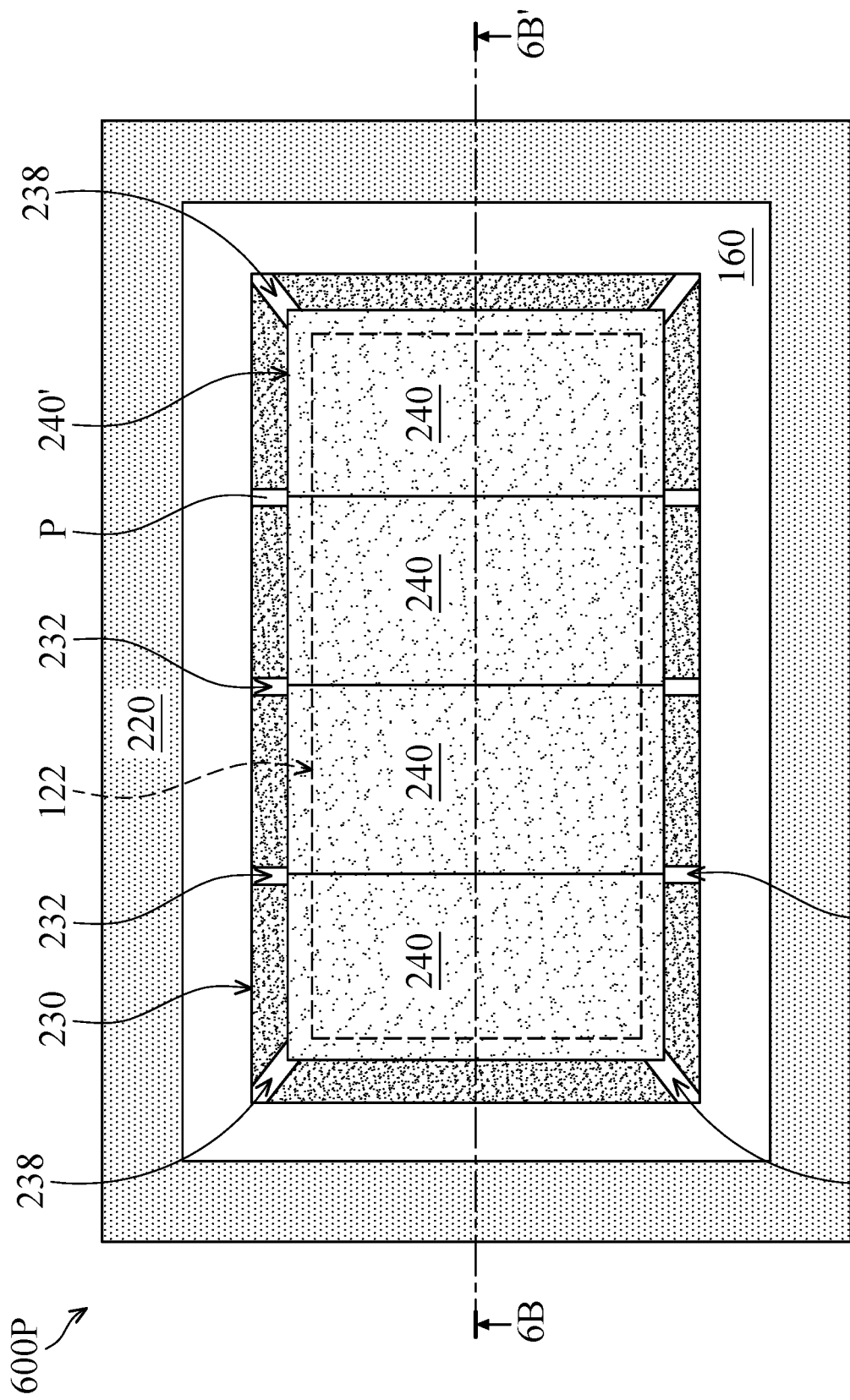

FIGS. 6A-6B are cross-sectional views of various stages of a process for forming a chip package structure, in accordance with some embodiments. FIG. 6A-1 is a top view of the structure of FIG. 6A, in accordance with some embodiments. FIG. 6A is a cross-sectional view illustrating the structure along a sectional line 6A-6A' in FIG. 6A-1, in accordance with some embodiments.

As shown in FIGS. 6A and 6A-1, after the step of FIG. 1B, a ring structure 210 is disposed over the adhesive layer 180, an adhesive layer 220 is formed over the ring structure 210, and a ring dam 230 and heat conductive structures 240 are formed over a top surface P1 of the chip package P, in accordance with some embodiments.

The heat conductive structures 240 have a rectangle shape, in accordance with some embodiments. The heat conductive structures 240 are arranged in an array, in accordance with some embodiments. The ring dam 230 has gaps 232 and 238, in accordance with some embodiments. The heat conductive structures 240 are separated by gaps 242, in accordance with some embodiments. The gaps 242 extend toward the gaps 232, in accordance with some embodiments. The gaps 238 are in corner portions 230c of the ring dam 230, in accordance with some embodiments.

FIG. 6B-1 is a top view of the structure of FIG. 6B, in accordance with some embodiments. For the sake of simplicity, FIG. 6B-1 omits the heat dissipation lid of the structure of FIG. 6B, in accordance with some embodiments. FIG. 6B is a cross-sectional view illustrating the structure along a sectional line 6B-6B' in FIG. 6B-1, in accordance with some embodiments.

As shown in FIGS. 6B and 6B-1, the heat dissipation lid 250 is disposed over the heat conductive structures 240, the ring dam 230, and the adhesive layer 220, and an annealing process is performed to soften the heat conductive structures 240, the ring dam 230, and the adhesive layer 220, in accordance with some embodiments.

The heat dissipation lid 250 is bonded to the chip package P through the heat conductive structures 240, the ring dam 230, and the adhesive layer 220, in accordance with some embodiments. In this step, a chip package structure 600P is substantially formed, in accordance with some embodiments.

Figure 7A:
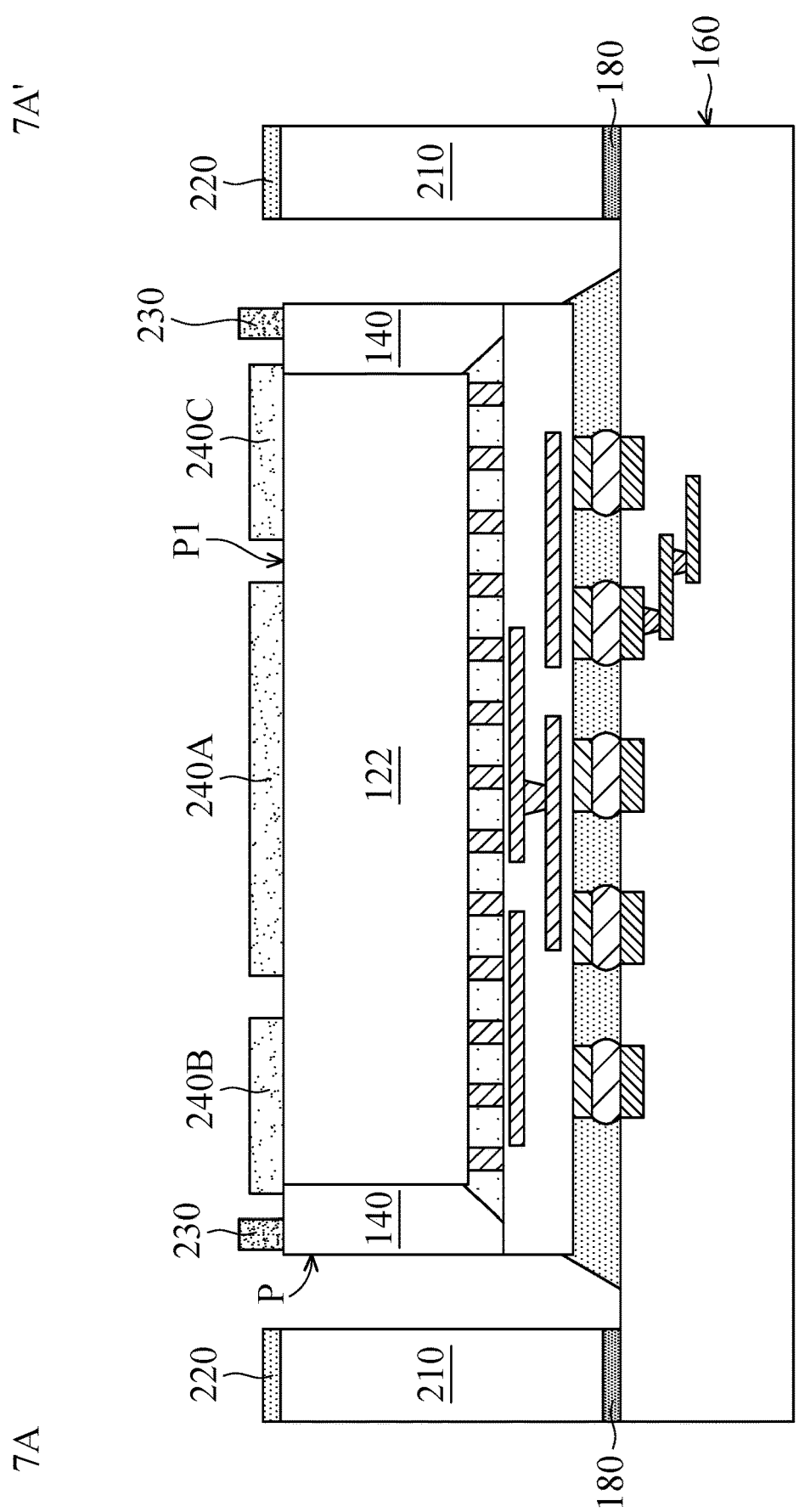
FIG. 7A is a cross-sectional view of various stages of a process for forming a chip package structure, in accordance with some embodiments.
Figures 1, 7A:
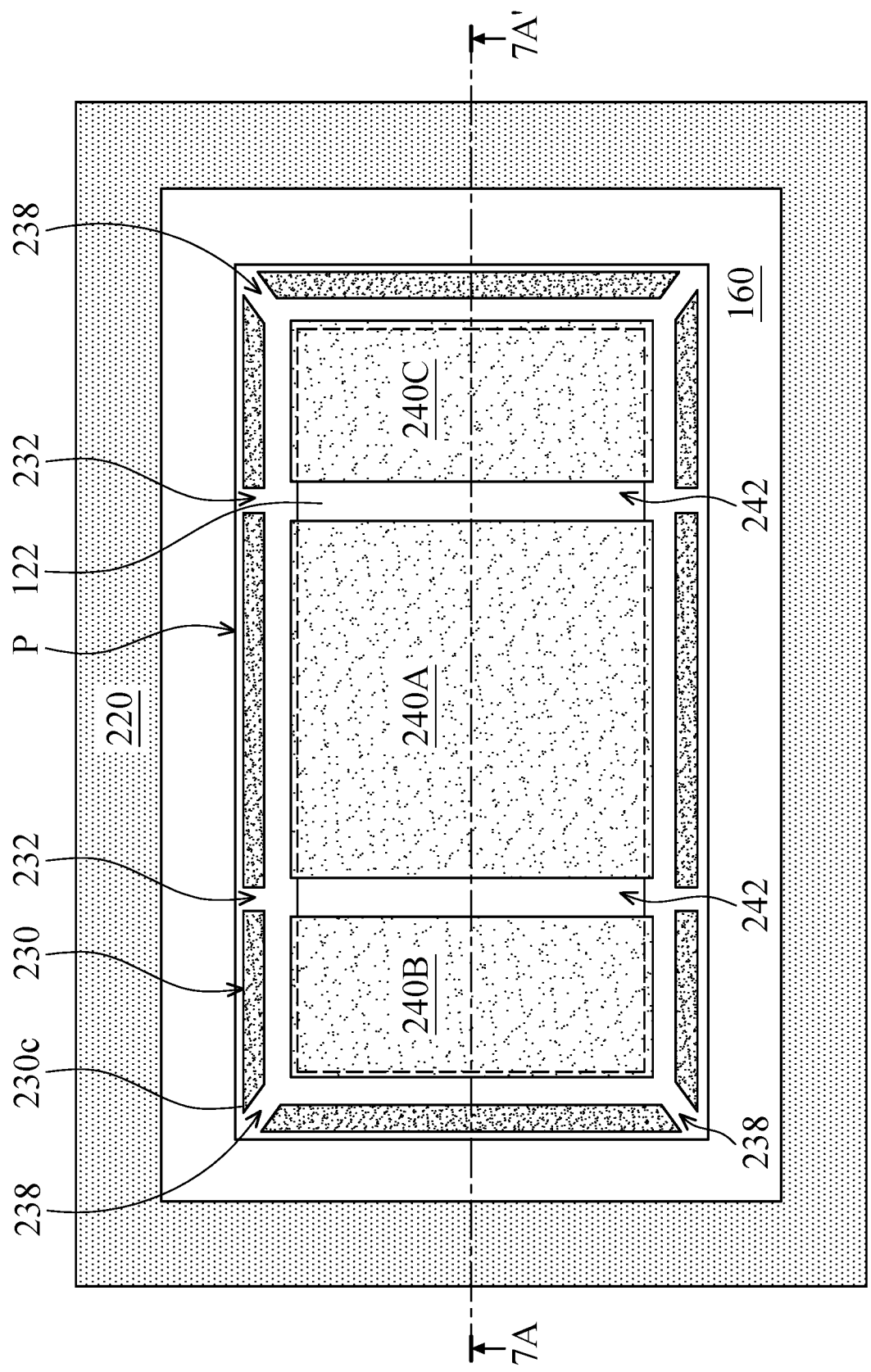
Figure 7B:
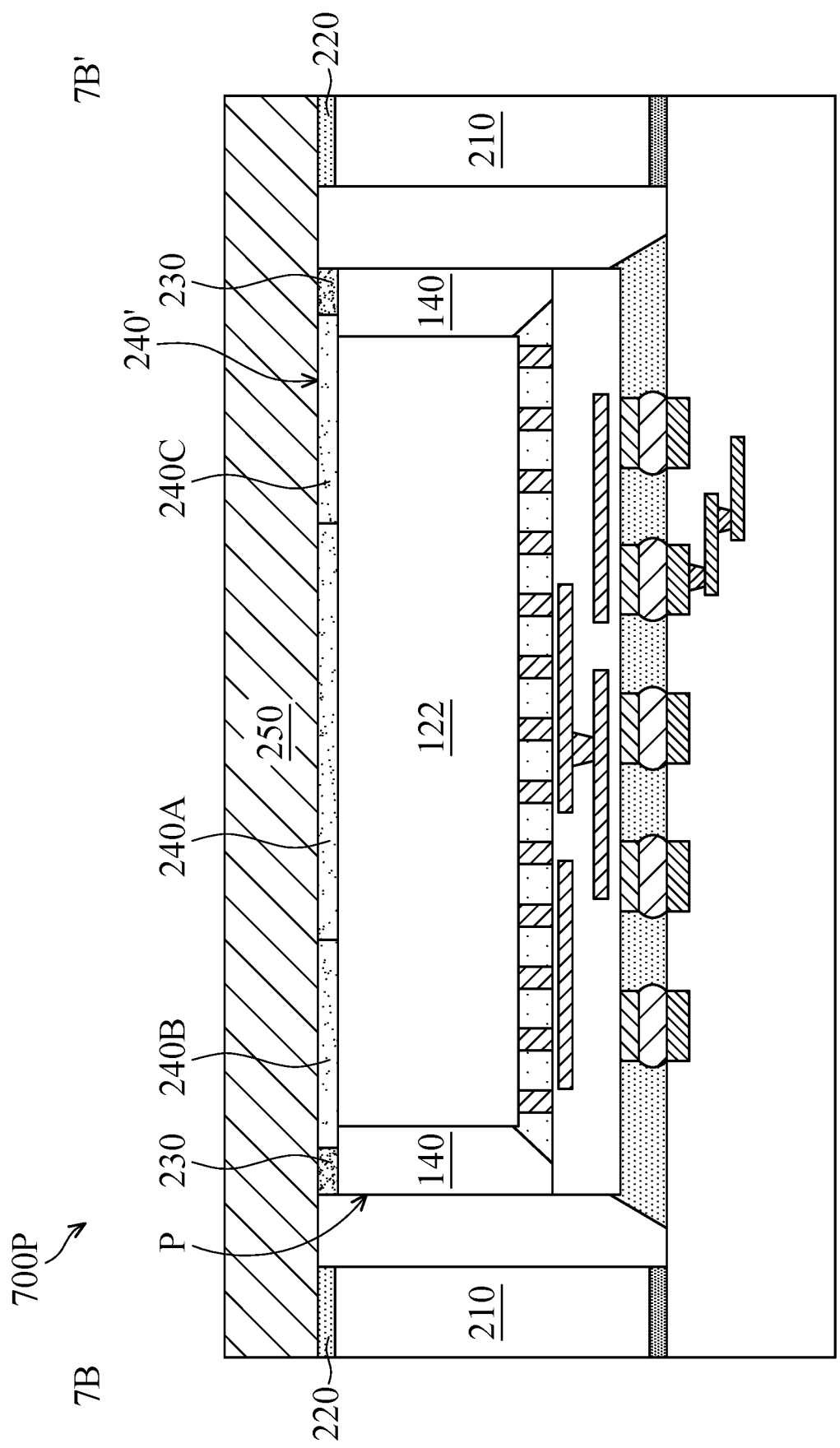
FIG. 7B is a cross-sectional view of various stages of a process for forming a chip package structure, in accordance with some embodiments.
Figures 1, 7B:
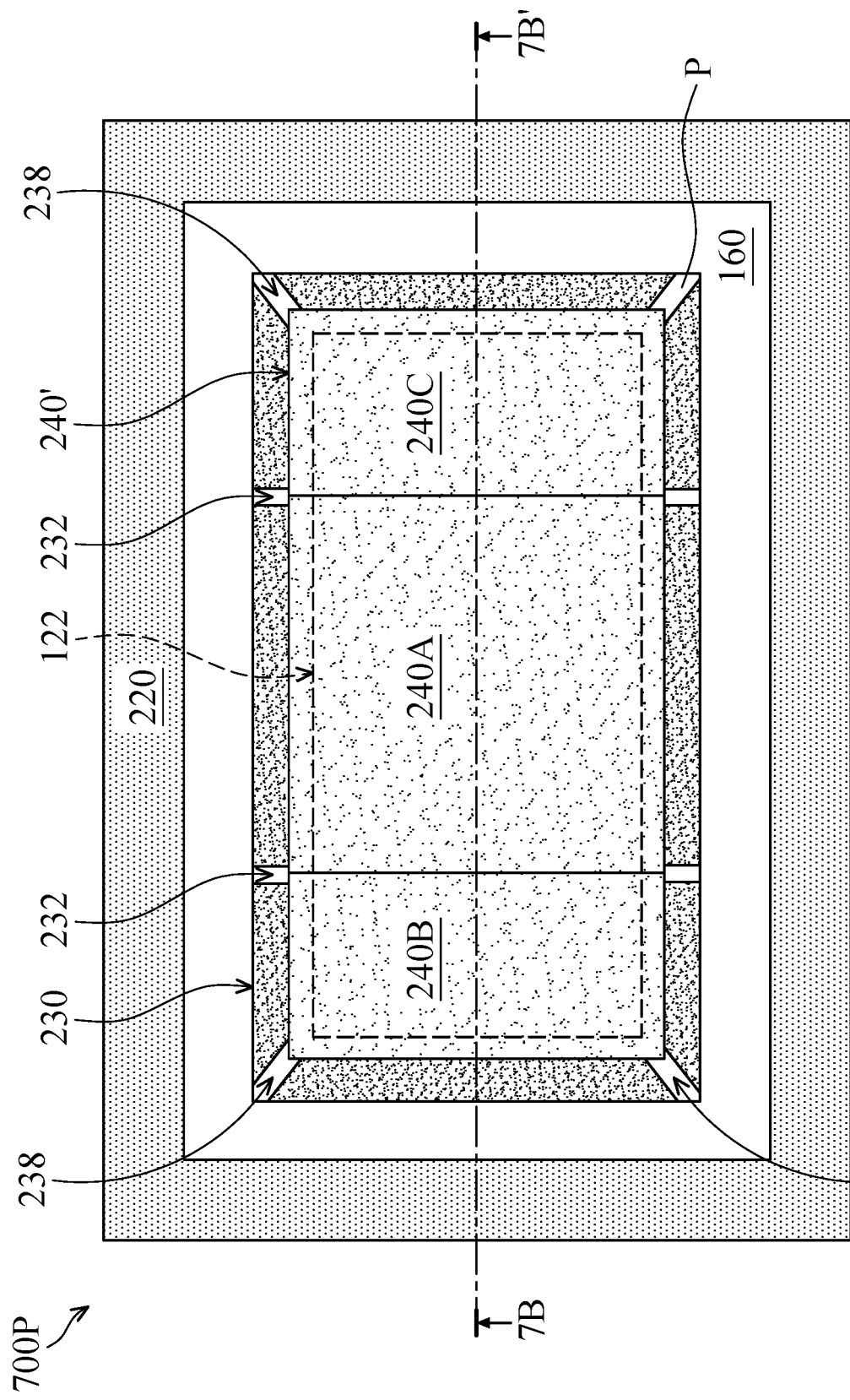

FIGS. 7A-7B are cross-sectional views of various stages of a process for forming a chip package structure, in accordance with some embodiments. FIG. 7A-1 is a top view of the structure of FIG. 7A, in accordance with some embodiments. FIG. 7A is a cross-sectional view illustrating the structure along a sectional line 7A-7A' in FIG. 7A-1, in accordance with some embodiments.

As shown in FIGS. 7A and 7A-1, after the step of FIG. 1B, a ring structure 210 is disposed over the adhesive layer 180, an adhesive layer 220 is formed over the ring structure 210, and a ring dam 230 and heat conductive structures 240A, 240B, and 240C are formed over a top surface P1 of the chip package P, in accordance with some embodiments.

The shape of the heat conductive structure 240A is different from the shape of the heat conductive structures 240B and 240C, in accordance with some embodiments. For example, the heat conductive structure 240A has a square shape, and the heat conductive structures 240B and 240C have a rectangle shape. The heat conductive structures 240A, 240B, and 240C have different sizes, in accordance with some embodiments. For example, the heat conductive structure 240A is wider than the heat conductive structure 240B or 240C, in accordance with some embodiments.

The ring dam 230 has gaps 232 and 238, in accordance with some embodiments. The heat conductive structures 240A, 240B, and 240C are separated by gaps 242, in accordance with some embodiments. The gaps 242 extend toward the gaps 232, in accordance with some embodiments. The gaps 238 are in corner portions 230c of the ring dam 230, in accordance with some embodiments.

FIG. 7B-1 is a top view of the structure of FIG. 7B, in accordance with some embodiments. For the sake of simplicity, FIG. 7B-1 omits the heat dissipation lid of the structure of FIG. 7B, in accordance with some embodiments. FIG. 7B is a cross-sectional view illustrating the structure along a sectional line 7B-7B' in FIG. 7B-1, in accordance with some embodiments.

As shown in FIGS. 7B and 7B-1, the heat dissipation lid 250 is disposed over the heat conductive structures 240A, 240B, and 240C, the ring dam 230, and the adhesive layer 220, and an annealing process is performed to soften the heat conductive structures 240A, 240B, and 240C, the ring dam 230, and the adhesive layer 220, in accordance with some embodiments.

The heat dissipation lid 250 is bonded to the chip package P through the heat conductive structures 240A, 240B, and 240C, the ring dam 230, and the adhesive layer 220, in accordance with some embodiments. In this step, a chip package structure 700P is substantially formed, in accordance with some embodiments.

Figure 8:
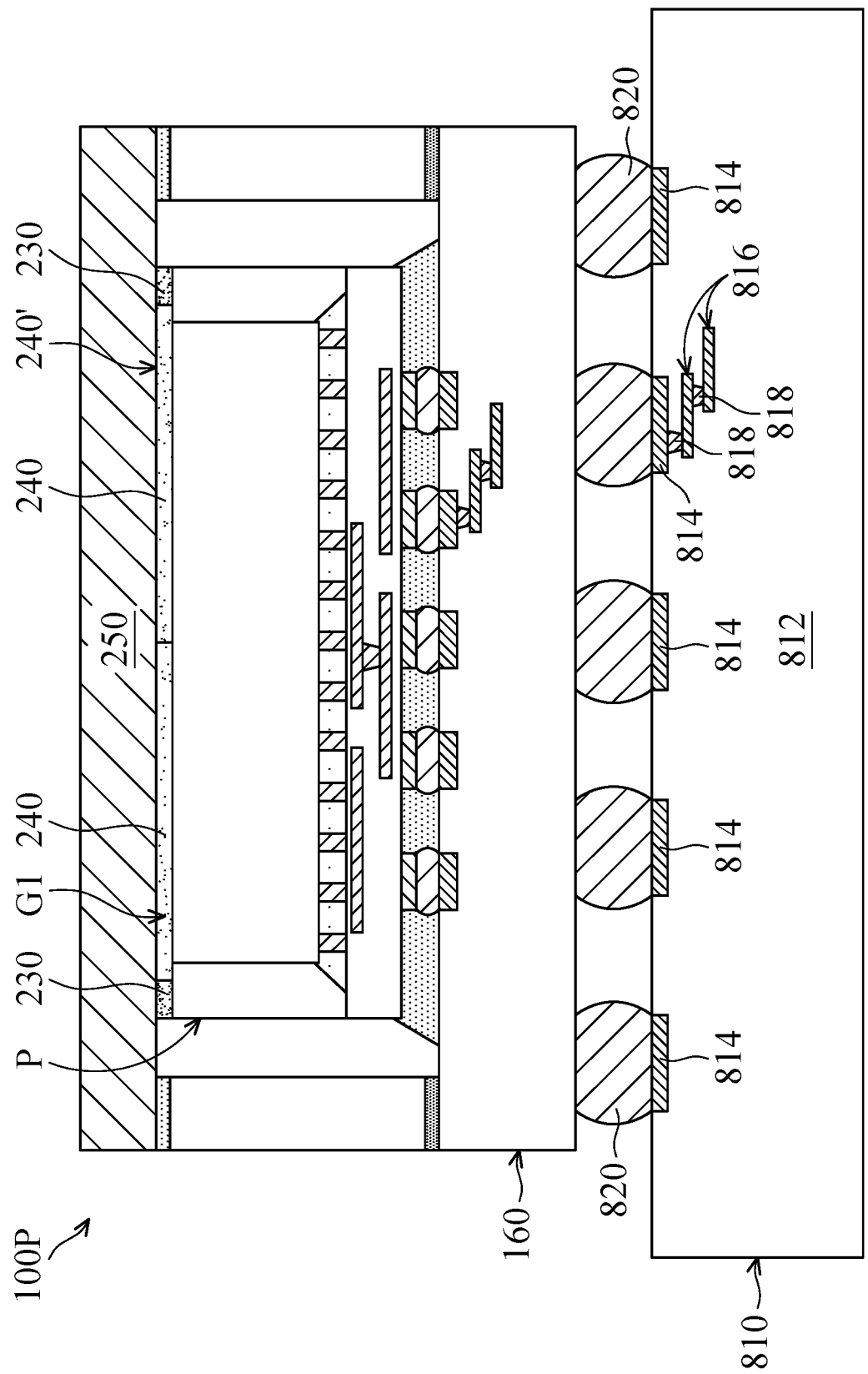
FIG. 8 is a cross-sectional view illustrating a chip package structure bonded to a circuit substrate, in accordance with some embodiments.

FIG. 8 is a cross-sectional view illustrating a chip package structure bonded to a circuit substrate, in accordance with some embodiments. As shown in FIG. 8, the chip package structure 100P of FIG. 1D is bonded to a circuit substrate 810 through solder bumps 820 using an annealing process, in accordance with some embodiments. The chip package structure 100P is also referred to as a ball grid array (BGA) package structure, in accordance with some embodiments.

Since the ring dam 230 of the chip package structure 100P is able to constrain most of the heat conductive structures 240 in the gap G1 between the heat dissipation lid 250 and the chip package P, the chip package structure 100P is able to withstand the annealing process, in accordance with some embodiments.

The circuit substrate 810 includes a dielectric layer 812, conductive pads 814, wiring layers 816, and conductive vias 818, in accordance with some embodiments. The conductive pads 814 are embedded in the dielectric layer 812, in accordance with some embodiments. The solder bumps 820 are connected between the conductive pads 814 and conductive pads (not shown) of the wiring substrate 160 of the chip package structure 100P, in accordance with some embodiments.

The wiring layers 816 and the conductive vias 818 are formed in the dielectric layer 812, in accordance with some embodiments. The conductive vias 818 are electrically connected between different wiring layers 816 and between the wiring layer 816 and the conductive pads 814, in accordance with some embodiments. For the sake of simplicity, FIG. 8 only shows two of the wiring layers 816, in accordance with some embodiments.

The dielectric layer 812 is made of an insulating material such as a polymer material (e.g., polybenzoxazole or polyimide), nitride (e.g., silicon nitride), oxide (e.g., silicon oxide), silicon oxynitride, or the like, in accordance with some embodiments.

The conductive pads 814 are made of a conductive material, such as metal (e.g. copper, aluminum, or tungsten) or alloys thereof, in accordance with some embodiments. The wiring layers 816 are made of a conductive material, such as metal (e.g. copper, aluminum, or tungsten) or alloys thereof, in accordance with some embodiments. The conductive vias 818 are made of a conductive material, such as metal (e.g. copper, aluminum, or tungsten) or alloys thereof, in accordance with some embodiments.

In some embodiments, the conductive pads 814, the wiring layers 816, and the conductive vias 818 are made of the same material. In some other embodiments. the conductive pads 814, the wiring layers 816, and the conductive vias 818 are made of different materials.

Figure 9:
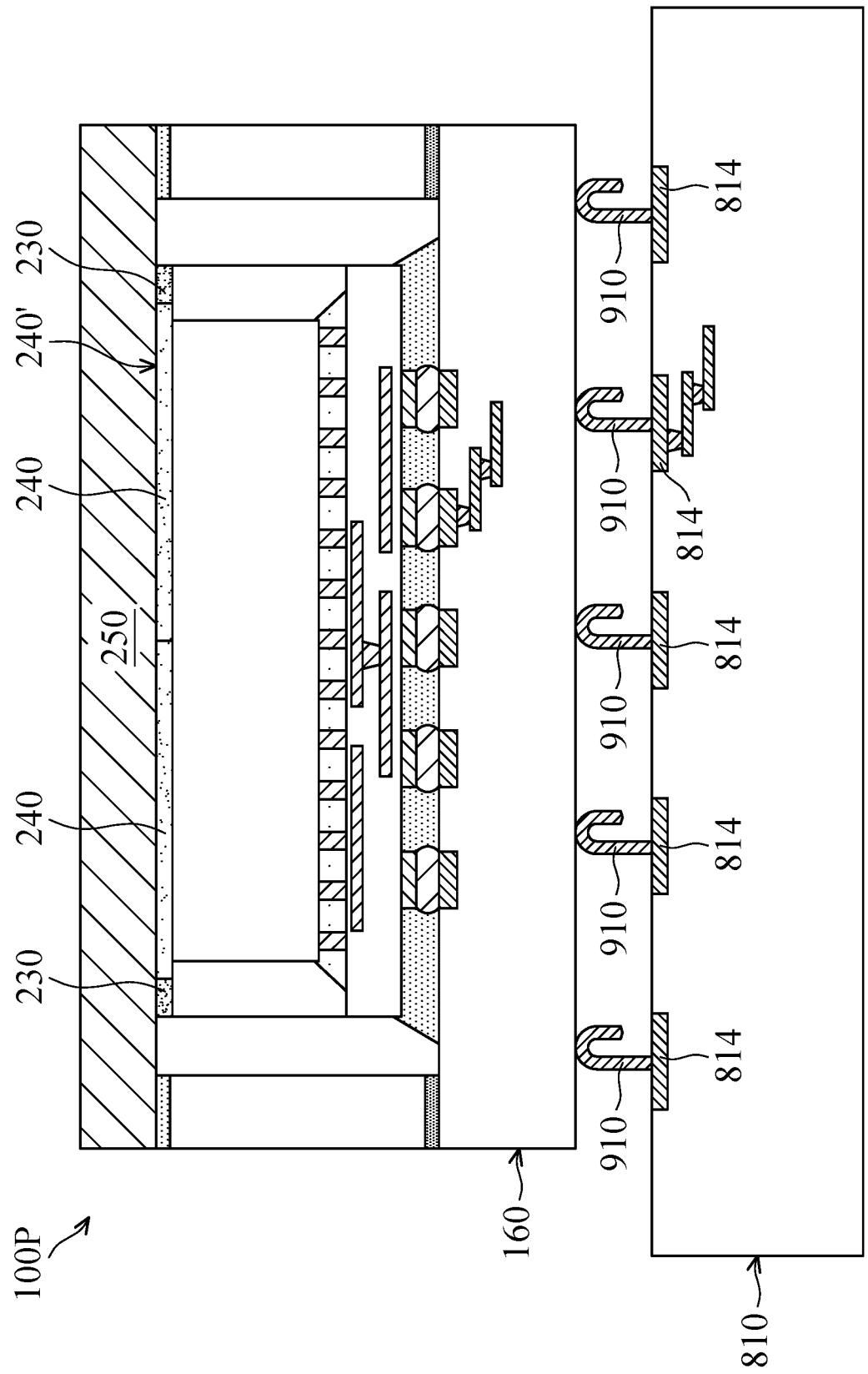
FIG. 9 is a cross-sectional view illustrating a chip package structure bonded to a circuit substrate, in accordance with some embodiments.

FIG. 9 is a cross-sectional view illustrating a chip package structure bonded to a circuit substrate, in accordance with some embodiments. As shown in FIG. 9, the chip package structure 100P of FIG. 1D is bonded to a circuit substrate 810 through conductive pins 910, in accordance with some embodiments. The chip package structure 100P is also referred to as a land grid array (LGA) package structure, in accordance with some embodiments.

The conductive pins 910 are connected between the conductive pads 814 and conductive pads (not shown) of the wiring substrate 160 of the chip package structure 100P, in accordance with some embodiments. The conductive pins 910 are made of a conductive material, such as metal (e.g. gold or copper) or alloys thereof, in accordance with some embodiments.

Figure 10:
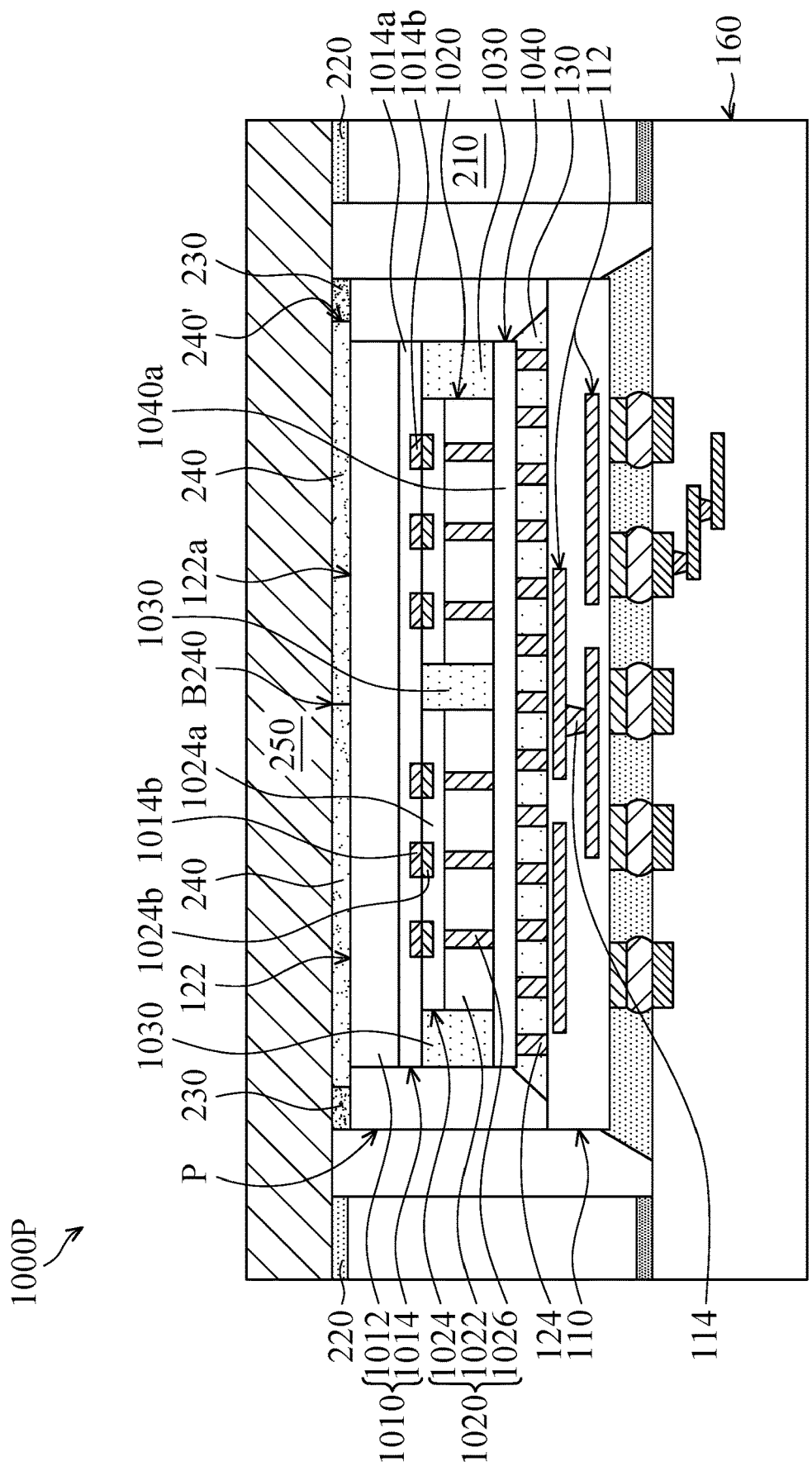
FIG. 10 is a cross-sectional view illustrating a chip package structure 1000P, in accordance with some embodiments.

FIG. 10 is a cross-sectional view illustrating a chip package structure 1000P, in accordance with some embodiments. As shown in FIG. 10, the chip package structure 1000P is one kind of the chip package structure 100P of FIG. 1D, in accordance with some embodiments. The chip structure 122 is a system on integrated circuit (SOIC) device, in accordance with some embodiments.

The chip structure 122 includes chips 1010 and 1020, a dielectric layer 1030, and a redistribution layer 1040, in accordance with some embodiments. The chip 1010 includes a substrate 1012 and an interconnect structure 1014 under the substrate 1012, in accordance with some embodiments.

In some embodiments, the substrate 1012 is made of an elementary semiconductor material including silicon or germanium in a single crystal structure, a polycrystal structure, or an amorphous structure. In some other embodiments, the substrate 1012 is made of a compound semiconductor, such as silicon carbide, gallium arsenide, gallium phosphide, indium phosphide, indium arsenide, an alloy semiconductor, such as SiGe or GaAsP, or a combination thereof. The substrate 1012 may also include multi-layer semiconductors, semiconductor on insulator (SOI) (such as silicon on insulator or germanium on insulator), or a combination thereof.

In some embodiments, the substrate 1012 is a device wafer that includes various device elements. In some embodiments, the various device elements are formed in and/or over the substrate 1012. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 1012. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 1012. The isolation features are used to surround active regions and electrically isolate various device elements formed in and/or over the substrate 1012 in the active regions. In some embodiments, the isolation features include shallow trench isolation (STI) features, local oxidation of silicon (LOCOS) features, other suitable isolation features, or a combination thereof.

The interconnect structure 1014 includes a dielectric layer 1014a, wiring layers (not shown), conductive vias (not shown), and conductive pads 1014b, in accordance with some embodiments. The wiring layers, the conductive vias, and the conductive pads 1014b are in the dielectric layer 1014a, in accordance with some embodiments. The conductive vias are electrically connected between the wiring layers, between the wiring layer and the conductive pads 1014b, and between the wiring layer and the device elements, in accordance with some embodiments.

The dielectric layer 1014a is made of a dielectric material, such as an oxide material (e.g., silicon oxide), in accordance with some embodiments. The wiring layers, the conductive vias, and the conductive pads 1014b are made of conductive materials, such as metal (e.g., copper, aluminum, or tungsten) or alloys thereof, in accordance with some embodiments.

Each chip 1020 includes a substrate 1022, an interconnect structure 1024, and through substrate vias 1026, in accordance with some embodiments. The interconnect structure 1024 is over the substrate 1022, in accordance with some embodiments. The through substrate vias 1026 penetrate through the substrate 1022, in accordance with some embodiments.

In some embodiments, the substrate 1022 is made of an elementary semiconductor material including silicon or germanium in a single crystal structure, a polycrystal structure, or an amorphous structure. In some other embodiments, the substrate 1022 is made of a compound semiconductor, such as silicon carbide, gallium arsenide, gallium phosphide, indium phosphide, indium arsenide, an alloy semiconductor, such as SiGe or GaAsP, or a combination thereof. The substrate 1022 may also include multi-layer semiconductors, semiconductor on insulator (SOI) (such as silicon on insulator or germanium on insulator), or a combination thereof.

In some embodiments, the substrate 1022 is a device wafer that includes various device elements. In some embodiments, the various device elements are formed in and/or over the substrate 1022. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 1022. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 1022. The isolation features are used to surround active regions and electrically isolate various device elements formed in and/or over the substrate 1022 in the active regions. In some embodiments, the isolation features include shallow trench isolation (STI) features, local oxidation of silicon (LOCOS) features, other suitable isolation features, or a combination thereof.

The interconnect structure 1024 includes a dielectric layer 1024a, wiring layers (not shown), conductive vias (not shown), and conductive pads 1024b, in accordance with some embodiments. The wiring layers, the conductive vias, and the conductive pads 1024b are in the dielectric layer 1024a, in accordance with some embodiments. The conductive vias are electrically connected between the wiring layers, between the wiring layer and the conductive pads 1024b, between the wiring layer and the device elements, and between the wiring layer and the through substrate vias 1026, in accordance with some embodiments.

The dielectric layer 1024a is made of a dielectric material, such as an oxide material (e.g., silicon oxide), in accordance with some embodiments. The wiring layers, the conductive vias, the conductive pads 1024b, and the through substrate vias 1026 are made of conductive materials, such as metal (e.g., copper, aluminum, or tungsten) or alloys thereof, in accordance with some embodiments.

The conductive pads 1024b of the chips 1020 are bonded with the conductive pads 1014b of the chips 1010, in accordance with some embodiments. The conductive pads 1024b are in direct contact with the conductive pads 1014b, in accordance with some embodiments.

The dielectric layer 1030 surrounds the chips 1020, in accordance with some embodiments. The dielectric layer 1030 is made of an insulating material such as a polymer material (e.g., polybenzoxazole or polyimide), nitride (e.g., silicon nitride), oxide (e.g., silicon oxide), silicon oxynitride, or the like, in accordance with some embodiments.

The redistribution layer 1040 is under the dielectric layer 1030 and the chips 1020, in accordance with some embodiments. The redistribution layer 1040 includes a dielectric layer 1040a, wiring layers (not shown), conductive vias (not shown), and conductive pads (not shown), in accordance with some embodiments. The wiring layers, the conductive vias, and the conductive pads are in the dielectric layer 1040a, in accordance with some embodiments.

The conductive vias are electrically connected between the wiring layers, between the wiring layer and the conductive pads, and between the wiring layer and the device elements, in accordance with some embodiments. The conductive pads are electrically connected to the conductive pillars 124 thereunder, in accordance with some embodiments.

The dielectric layer 1040a is made of a dielectric material, such as an oxide material (e.g., silicon oxide), in accordance with some embodiments. The wiring layers, the conductive vias, and the conductive pads are made of conductive materials, such as metal (e.g., copper, aluminum, or tungsten) or alloys thereof, in accordance with some embodiments.

Processes and materials for forming the chip package structures 200P, 300P, 400P, 500P, 600P, 700P, and 1000P may be similar to, or the same as, those for forming the chip package structure 100P described above.

In accordance with some embodiments, chip package structures and methods for forming the same are provided. The methods (for forming the chip package structure) form heat conductive structures and a ring dam over a chip package and then bond a heat dissipation lid to the chip package through the heat conductive structures and the ring dam. Before the heat dissipation lid is bonded to the chip package, the heat conductive structures are separated by first gaps, which extend toward second gaps of the ring dam. During the bonding process, the heat conductive structures extend toward each other until the heat conductive structures contact each other, and the air in the first gaps flows out through the second gaps of the ring dam, which prevents the formation of voids in the heat conductive structures. The ring dam is able to constrain the heat conductive structures in a gap between the heat dissipation lid and the chip package. Therefore, the heat dissipation efficiency of the chip package structure is improved. As a result, the life span of the chip package structure is increased.

In accordance with some embodiments, a method for forming a chip package structure is provided. The method includes disposing a chip package over a wiring substrate. The method includes forming a first heat conductive structure and a second heat conductive structure over the chip package. The first heat conductive structure and the second heat conductive structure are separated by a first gap. The method includes bonding a heat dissipation lid to the chip package through the first heat conductive structure and the second heat conductive structure. The first heat conductive structure and the second heat conductive structure extend toward each other until the first heat conductive structure contacts the second heat conductive structure during bonding the heat dissipation lid to the chip package.

In accordance with some embodiments, a method for forming a chip package structure is provided. The method includes disposing a chip package over a wiring substrate. The method includes forming a heat conductive structure and a ring dam over the chip package. The ring dam surrounds the heat conductive structure, the ring dam and the heat conductive structure are separated by a first gap, and the ring dam has a second gap communicating with the first gap. The method includes bonding a heat dissipation lid to the chip package through the heat conductive structure and the ring dam. The heat conductive structure and the ring dam extend toward each other until the heat conductive structure contacts the ring dam during bonding the heat dissipation lid to the chip package.

In accordance with some embodiments, a chip package structure is provided. The chip package structure includes a wiring substrate. The chip package structure includes a chip package over the wiring substrate. The chip package structure includes a first heat conductive structure over the chip package. The chip package structure includes a ring dam over the chip package and surrounding the first heat conductive structure. The ring dam has a gap. The chip package structure includes a heat dissipation lid over the first heat conductive structure and the ring dam.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:
    disposing a chip package over a wiring substrate;
    forming a first heat conductive structure and a second heat conductive structure over the chip package, wherein the first heat conductive structure and the second heat conductive structure are separated by a first gap; and
    bonding a heat dissipation lid to the chip package through the first heat conductive structure and the second heat conductive structure, wherein the first heat conductive structure and the second heat conductive structure extend toward each other until the first heat conductive structure contacts the second heat conductive structure during bonding the heat dissipation lid to the chip package.

2. The method for forming the chip package structure as claimed in claim 1, wherein the bonding of the heat dissipation lid to the chip package comprises:
    disposing the heat dissipation lid over the first heat conductive structure and the second heat conductive structure; and
    performing an annealing process to soften the first heat conductive structure and the second heat conductive structure.

3. The method for forming the chip package structure as claimed in claim 1, wherein a first sidewall of the first heat conductive structure and a second sidewall of the second heat conductive structure face each other, and the first sidewall is parallel to the second sidewall.

4. The method for forming the chip package structure as claimed in claim 1, further comprising:
    forming a ring dam over the chip package before bonding the heat dissipation lid to the chip package, wherein the ring dam surrounds the first heat conductive structure and the second heat conductive structure.

5. The method for forming the chip package structure as claimed in claim 4, wherein a first material of the ring dam is different from a second material of the first heat conductive structure and a third material of the second heat conductive structure.

6. The method for forming the chip package structure as claimed in claim 4, wherein the ring dam has a second gap.

7. The method for forming the chip package structure as claimed in claim 6, wherein the first gap between the first heat conductive structure and the second heat conductive structure extends toward the second gap.

8. The method for forming the chip package structure as claimed in claim 6, wherein the ring dam further has a third gap, and the first gap is between the second gap and the third gap.

9. The method for forming the chip package structure as claimed in claim 6, wherein the first gap between the first heat conductive structure and the second heat conductive structure is wider than the second gap of the ring dam before bonding the heat dissipation lid to the chip package.

10. The method for forming the chip package structure as claimed in claim 6, wherein the first heat conductive structure extends into the second gap of the ring dam after bonding the heat dissipation lid to the chip package.

11. The method for forming the chip package structure as claimed in claim 10, wherein the first heat conductive structure extends out of the second gap of the ring dam after bonding the heat dissipation lid to the chip package.

12. The method for forming the chip package structure as claimed in claim 1, further comprising:
    forming a third heat conductive structure over the chip package, wherein the second heat conductive structure is between the first heat conductive structure and the third heat conductive structure, a first distance between the first heat conductive structure and the second heat conductive structure is substantially equal to a second distance between the second heat conductive structure and the third heat conductive structure before bonding the heat dissipation lid to the chip package.

13. A method for forming a chip package structure, comprising:
    disposing a chip package over a wiring substrate;
    forming a heat conductive structure and a ring dam over the chip package, wherein the ring dam surrounds the heat conductive structure, the ring dam and the heat conductive structure are separated by a first gap, and the ring dam has a second gap communicating with the first gap; and
    bonding a heat dissipation lid to the chip package through the heat conductive structure and the ring dam, wherein the heat conductive structure and the ring dam extend toward each other until the heat conductive structure contacts the ring dam during bonding the heat dissipation lid to the chip package.

14. The method for forming the chip package structure as claimed in claim 13, wherein the second gap of the ring dam is adjacent to a corner of the heat conductive structure.

15. The method for forming the chip package structure as claimed in claim 13, wherein a first thickness of the ring dam is greater than or equal to a second thickness of the heat conductive structure before bonding the heat dissipation lid to the chip package.

16. The method for forming the chip package structure as claimed in claim 15, wherein the first thickness of the ring dam is substantially equal to the second thickness of the heat conductive structure after bonding the heat dissipation lid to the chip package.

17. A method for forming a chip package structure, comprising:
    disposing a chip package over a wiring substrate;
    forming a first heat conductive structure and a ring dam over the chip package, wherein the ring dam surrounds the first heat conductive structure, the ring dam and the first heat conductive structure are separated by a first gap, the ring dam has a second gap communicating with the first gap, and an air is in the first gap; and bonding a heat dissipation lid to the chip package through the first heat conductive structure and the ring dam, wherein the first heat conductive structure and the ring dam are flattened by the heat dissipation lid after bonding the heat dissipation lid to the chip package, and the air originally in the first gap flows out through the second gap of the ring dam during bonding the heat dissipation lid to the chip package.

18. The method for forming the chip package structure as claimed in claim 17, wherein a first thermal conductivity of the first heat conductive structures is greater than a second thermal conductivity of the ring dam.

19. The method for forming the chip package structure as claimed in claim 17, wherein a first width of the first heat conductive structure and a second width of the ring dam are increased after bonding the heat dissipation lid to the chip package.

20. The method for forming the chip package structure as claimed in claim 17, further comprising:

forming a second heat conductive structure over the chip package during forming the first heat conductive structure and the ring dam over the chip package, wherein the ring dam further surrounds the second heat conductive structure, the second heat conductive structure and the first heat conductive structure are separated by a third gap, the second gap of the ring dam communicates with the third gap, and the third gap substantially disappears after bonding the heat dissipation lid to the chip package.

* * * * *